(12) United States Patent
Singer et al.

(10) Patent No.: US 7,091,505 B2
(45) Date of Patent: Aug. 15, 2006

(54) COLLECTOR WITH FASTENING DEVICES FOR FASTENING MIRROR SHELLS

(75) Inventors: Wolfgang Singer, Aalen (DE); Wilhelm Egle, Aalen (DE); Markus Weiss, Aalen (DE); Joachim Hainz, Aalen (DE); Joachim Wietzorrek, Aalen (DE); Johannes Wangler, Königsbronn (DE); Frank Melzer, Utzmemmingen (DE); Bernhard Gellrich, Aalen (DE); Bernhard Geuppert, Aalen (DE); Erich Schubert, Jestetten (DE); Martin Antoni, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 36 days.

(21) Appl. No.: 10/775,037

(22) Filed: Feb. 9, 2004

(65) Prior Publication Data

US 2004/0227103 A1 Nov. 18, 2004

Related U.S. Application Data

(63) Continuation-in-part of application No. PCT/EP02/08193, filed on Jul. 23, 2002.

(30) Foreign Application Priority Data

| Aug. 10, 2001 | (DE) | ................... 103 38 313 |
| Jan. 23, 2002 | (EP) | ............... PCT/EP02/00608 |
| Jul. 23, 2002 | (EP) | ............... PCT/EP02/08193 |

(51) Int. Cl.
*G21G 5/00* (2006.01)
*A61N 5/00* (2006.01)

(52) U.S. Cl. ................... 250/504 R; 250/494.1

(58) Field of Classification Search ............. 250/504 R
See application file for complete search history.

(56) References Cited

U.S. PATENT DOCUMENTS

| 1,865,441 | A |  | 7/1932 | Mutscheller |
| 5,192,869 | A |  | 3/1993 | Kumakhov .............. 250/505.1 |
| 5,745,547 | A |  | 4/1998 | Xiao .......................... 378/145 |
| 5,763,930 | A |  | 6/1998 | Partlo .................... 250/504 R |
| 5,768,339 | A |  | 6/1998 | O'Hara ...................... 378/147 |
| 6,064,072 | A |  | 5/2000 | Partlo et al. ........... 250/504 R |
| 6,198,793 | B1 |  | 3/2001 | Schultz et al. ................ 378/34 |
| 2004/0065817 | A1 | * | 4/2004 | Singer et al. ............... 250/228 |

FOREIGN PATENT DOCUMENTS

DE   30 01 059   2/1981

(Continued)

*Primary Examiner*—Nikita Wells
*Assistant Examiner*—David A. Vanore
(74) *Attorney, Agent, or Firm*—Ohlandt, Greeley, Ruggiero & Perle, L.L.P.

(57) ABSTRACT

There is provided a projection exposure system operable in a scanning mode along a scanning direction. The projection exposure system includes a collector that receives light having a wavelength $\leq 193$ nm and illuminates a region in a plane. The plane is defined by a local coordinate system having a y-direction parallel to the scanning direction and an x-direction perpendicular to the scanning direction. The collector includes (a) a first mirror shell, (b) a second mirror shell within the first mirror shell, and (c) a fastening device for fastening the first and second mirror shells. The mirror shells are substantially rotational symmetric about a common rotational axis. The fastening device has a support spoke that extends in a radial direction of the mirror shells, and the support spoke, when projected into the plane, yields a projection that is non-parallel to the y-direction.

11 Claims, 22 Drawing Sheets

FOREIGN PATENT DOCUMENTS

| | | |
|---|---|---|
| DE | 199 03 907 A1 | 8/2000 |
| EP | 724 150 A1 | 7/1996 |
| WO | 99/27542 | 6/1999 |
| WO | 99/57732 | 11/1999 |
| WO | 00/63922 | 10/2000 |
| WO | 01/08162 | 2/2001 |

* cited by examiner

COLLECTOR WITH FASTENING DEVICES FOR FASTENING MIRROR SHELLS

CROSS-REFERENCE TO RELATED APPLICATIONS

The present application is a continuation-in-part of International Application No. PCT/EP02/08193, filed Jul. 23, 2002, which claims priority of (a) International Application No. PCT/EP02/00608, filed Jan. 23, 2002, and (b) German Patent Application No. 101 38 313.4, filed Aug. 10, 2001.

BACKGROUND OF THE INVENTION

1. Field of the Invention

The invention relates to a collector for a projection exposure apparatus which is operated in a scanning mode along a scanning direction with a wavelength $\leq 193$ nm, preferably $\leq 126$ nm, more preferably with wavelengths in the extreme UV (EUV)-region. Said collector receives light from a light source and illuminates an area in a plane to be illuminated. The collector comprises a plurality of rotational symmetric mirror shells which are arranged within each other about a common rotational axis.

The invention further also provides an illumination system with such a collector, a projection exposure apparatus with an illumination system in accordance with the invention as well as a method for the exposure of microstructures.

2. Description of the Related Art

Nested collectors for wavelengths $\leq 193$ nm, especially wavelengths in the region of X-rays, have become known from a plurality of documents.

U.S. Pat. No. 5,768,339 shows a collimator for X-rays, with the collimator comprising several paraboloidal reflectors. The collimator according to U.S. Pat. No. 5,768,339 is used to form into a parallel beam a isotropically radiated ray beam of an X-ray source.

A nested collector for X-rays has become known from U.S. Pat. No. 1,865,441 which is used—as in the case of U.S. Pat. No. 5,768,339—to collimate isotropic X-rays into a parallel beam of rays.

U.S. Pat. No. 5,763,930 shows a nested collector for a pinch plasma light source which is used to collect the radiation emitted by a light source and to focus the same in a waveguide.

U.S. Pat. No. 5,745,547 shows several arrangements of multi-channel optics which are used for concentrating the radiation of a source, especially X-rays, in a point. In order to achieve a high transmission efficiency, the invention according to U.S. Pat. No. 5,745,547 proposes elliptically shaped reflectors.

An arrangement has been disclosed in DE 30 01 059 C2 for the use in X-ray lithography systems which comprises parabolic mirrors arranged in a nested way between X-ray source and mask. These mirrors are arranged in such a way that the diverging X-rays are shaped into a parallel beam leaving the arrangement.

The arrangement according to DE 30 01 059 is merely used for achieving a favorable collimation for X-ray lithography.

The arrangement of nested reflectors as known from WO 99/27542 is used in an X-ray proximity lithography system in such a way that light of a light source is refocused so that a virtual light source is formed. The nested shells can have an ellipsoidal shape.

A nested reflector for high-energy photon sources is known from U.S. Pat. No. 6,064,072 which is used to shape the diverging X-rays into a parallel beam bundle.

WO 00/63922 shows a nested collector which is used to collimate a neutron beam.

A nested collector for X-rays is known from WO 01/08162 which is characterized by a surface roughness of the inner reflective surface, the individual mirror shells of less than 12 Å rms. The collectors shown in WO 01/08162 also comprise systems with multiple reflections, especially also Wolter systems, and are characterized by a high resolution, as is also demanded in X-ray lithography for example.

In addition to resolution, high requirements are also needed regarding evenness, uniformity and telecentricity with respect to illumination lens systems for EUV lithography, such as in DE 199 03 907 or WO 99/57732.

SUMMARY OF THE INVENTION

It is an object of the invention to provide a collector for an illumination system for microlithography with wavelengths $\leq 193$ nm, preferably $\leq 126$ nm, more preferably for wavelengths in the EUV range, which collector has a sufficient mechanical stability and a high light efficiency. Especially any negative effect with respect to uniformity of the illumination in the field plane by the collector should be avoided.

Various effects influence the uniformity of the illumination in the field plane. A first effect comes from the collector, especially the shadows from the holding devices of the collector shells and the shadows from the collector shells of finite thickness influence the uniformity, although an optical integrator may follow in the light path of the illumination system subsequent to the collector optics.

In operation the nested collector is heated up. By heating up the mirror shells the optical properties of the collector are influenced and thus the uniformity in the field plane. The change of optical properties may be in first order a focal drift. Further spherical aberration and astigmatism, and higher order aberrations.

To improve the uniformity in the field plane according to one aspect of the invention a nested collector which illuminates a plane on the image side and comprises a plurality of mirror shells which are rotational symmetric about a rotational axis and the individual mirror shells are held by fastening devices, the fastening devices are comprising support spokes extending in a radial direction.

The support spokes are arranged in such a way that when they are projected into the plane to be illuminated on the image side they are inclined relative to the y-direction of the local system of coordinates in this plane on the image side. That is, the projections of the spokes in the plane have either a positive slope or a negative slope relative to the y-direction, and so, are non-parallel to the y-direction. In this application the y-direction is the direction of the local system of coordinates which is parallel to the scanning direction of a projection exposure apparatus which is operated in a scanning mode and the x-direction is the direction of the local system of coordinates which is perpendicular to the scanning direction.

It generally applies that the mechanical stability is improved the more support spokes are used. In order to keep the loss of light by vignetting as low as possible by the support spokes extending in the radial direction, it is advantageous when the spokes are as narrow as possible. Especially preferably the support spokes have a shape which tapers in the radial direction towards the rotational axis. This leads to the advantage that a high stability is achieved and the loss of light by shading effects is limited because the percentage rate of shadowed area relative to the circumference of a shell is always approximately the same. This will be achieved when the width of the support spoke increases proportionally to the distance from the common rotational axis.

Preferably, the support spokes comprise grooves in which the individual mirror shells can be inserted for fixing. An especially stable embodiment is obtained when the mirror shells are glued together with the support spokes in the grooves.

The support spokes extend in radial direction in a plane defined by an x-axis (x-direction) and a y-axis (y-direction). The common rotational axis is substantially perpendicular to the plane defined by the x- and y-axis.

The mechanical stability of the collector is increased even further when in addition webs are provided which extend substantially parallel to the common rotational axis.

In order to keep any shading of the light by the extension of the spokes as low as possible, it is advantageous that the spokes taper in the direction of the rotational axis of the collector towards the plane to be illuminated.

In accordance with the invention, the influences of the mechanical holding devices on the uniformity of the illumination in the field plane can be kept low by an advantageous arrangement of the support spokes. This is achieved in that the support spokes are arranged such that when they are projected into the plane to be illuminated on the image side, they are inclined relative to the y-direction in the plane to be illuminated on the image side. It is especially advantageous when at least one support spoke of the plurality of support spokes of the collector extends parallel to the x-direction, i.e. perpendicular to the scanning direction, in the plane to be illuminated on the image side in which or close to which the first optical element is arranged with first raster elements. The images of all first raster elements of the first optical element are superimposed in the field plane and produce the illuminated field in the field plane.

It is especially advantageous when the raster elements are arranged on the first optical element in such a way that no raster element is arranged in the region of the shading or vignetting of a spoke extending in the x-direction, because the first raster elements which are shadowed completely by a supporting spoke cannot contribute anything to the illumination of the field in the field plane. The first raster elements are also denoted as field facets and the first optical element with first raster elements can also be denoted as a facetted mirror or fly eye's lens.

If further support spokes are provided, then it is especially advantageous when the further support spokes are arranged in such a way that the shadings which are caused by said support spokes by the projection into a plane to be illuminated on the image side extend such that the plurality of the first raster elements which are arranged on the first optical element are each intersected at different locations and are thus vignetted at different locations. The influence of the shading of the individual field facets by the supporting spokes on the uniformity of the field in the field plane is in such a case low because the images of the plurality of the field facets are superimposed in the field plane and each field facet is shaded at different locations. This means however, that when different field facets are vignetted at different locations, the shadings will only have a minor effect because all other field facets at this location are illuminated completely. The uniformity of the illumination in the field plane is thus distorted only to a low extent.

A uniformity of $\Delta SE(x)$ of better than 1.5% can thus be achieved in a system with six support spokes.

To improve the uniformity $\Delta SE(x)$ of the scan integrated energy $SE(x)$ in x-direction in the field plane in an another aspect of the invention, one has to compensate thermal expansion of the mirror shells due to heating, when radiation impinges onto the mirror shells.

In a first embodiment a support spoke of the collector is manufactured from a material with a thermal expansion coefficient, which provides for a substantially rotational symmetric expansion of each of the mirror shells under thermal load. By choosing a suitable material for the spokes, it is possible, that when radiation impinges onto a mirror shell and the mirror shell is deformed because it is heated up, the deformation is always substantially a rotational symmetric deformation. This has the advantage, that the optical properties of the collector remain constant in first order beside a focal shift, which can easily be compensated for by an axial source or collector displacement. Thus in a plane which is situated in the light path from the light source to the field plane downstream the collector an essentially continuous illumination is achieved. An essentially continuous illumination in this plane means in this application, that the first and the second mirror shell illuminate a first and second ring aperture element in this plane and the first and the second ring aperture element are essentially subsequently fill a connected area and there is essentially no gap between the first and the second ring aperture element although the first and the second mirror shell are be deformed under thermal load.

To compensate the focal shift one has to displace e.g. the light source as described in the following paragraph.

In a first step one assumes that each collector shell has a homogeneous temperature. This can be achieved if the material of the collector shell has a good thermal conductivity and if the collector shell is actively cooled and/or heated.

In a second step one assumes that the collector shells expand themselves with respect to a thermal center. The thermal center has the $\{z, y\}$—coordinates $\{l, 0\}$.

The thermal center of a collector shell is the reference point for the thermal expansion of the collector shell. The collector shells can be mounted individually or commonly. For individually mounted collector shells each collector shell has an individual thermal center. The mounting of each collector shell can be done e.g. by spokes as described in this application. The mounting of a mirror shell in this application is also denoted as fastening of a mirror shell.

In a third step one assumes that the focal length L of a mirror shell is always greater than the distance |l| between the point of mounting of the mirror shell and the position of the light source.

With these assumptions one can calculate for each point $\{z, y\}$ of a rotational symmetric collector shell around a common rotational axis, which extends in z-direction, the coordinates $\{z, y\}$ of the heated up mirror shell. If a mirror shell is heated up by a temperature $\Delta T$ above room temperature of e.g. 22° C. then the coordinates of a mirror shell transform as follows:

$$\{z, y\} \xrightarrow{\text{thermal expansion by } \Delta T} \{l + (z - l)(1 + \alpha \Delta T), y(1 + \alpha \Delta T)\}$$

wherein
- I: distance between the thermal center or point of mounting of a mirror shell and the position of the light source
- α: thermal expansion coefficient
- ΔT: difference between the temperature of the heated up mirror shell and room temperature of e.g. 22° C.

If the light source and the first focal point of the mirror shell is situated in the position {0, 0} and the second focal point or intermediate focal point in the position {L, 0}, then a temperature difference of ΔT leads to the coordinates {−IαΔT, 0} as a position for the first focal point and {I+(L−I)(1+αΔT), 0} as a position for the second or intermediate focal point. If one claims that also for this heated up mirror shell the second focal point should lie at the position {L, 0} as in the case of a mirror shell, which is held at room temperature of e.g. 22° C. then the light source must be shifted. With the linear magnification β the following equation results for the shifting or the defocusing Δz:

$$(\Delta z - (-I\alpha\Delta T)\beta^2 = -(L-I)\alpha\Delta T$$

In a preferred embodiment the light source is an extended light source. Most preferably the extension of the light source is equal or greater than the necessary defocusing to compensate the focal shift induced by heating up or cooling the mirror shells. Then the light source must not be defocused.

In such a case one can assume that the mounting point {I, 0}, which is also denoted as a fastening point {I, 0} of the mirror shell I is a variable independent from temperature, since the light source must not be defocused to compensate for the focal shift and the equation $$I = \frac{L}{1-\beta^2} \quad (a)$$

with
- I: distance between the thermal center or point of mounting and the position of the light source
- L: z-position for the second focal point
- β: linear magnification results.

If one choose the fastening point of the collector shell as in equation (a), then the temperature of the mirror shell can alter without having any effect with regard to the second focal point of the collector. A fastening of the mirror shells in such a position is therefore preferable and called "isothermal fastening". If a collector shell is fastened isothermal then despite the deformation of the mirror shells under thermal load the optical characteristics of the collector remain substantially unchanged. This is due to the fact, that for a isothermal fastening the second focal point remains substantially constant.

In a further improved embodiment the material of the support spoke is chosen of such a thermal expansion coefficient, that when the mirror shells are heated up, they deform substantially equal in shape.

If different mirror shells deform substantially equal in shape, this has also the advantage, that as in the case before, the ring aperture elements in a plane situated in a light path from the light source to the field plane of the projection exposure apparatus downstream the collector are essentially continuously adjacent to each other and therefore essentially no gap between the first and the second ring aperture element occurs.

In a further advantageous embodiment, one or more mirror shells can be cooled or heated. The cooling and/or the heating can be such, that the deformations of different shells are essentially equal.

A further improvement of the uniformity in the field plane in yet another aspect of the invention can be achieved, if one takes into account the contribution of light reflected by different mirror shells to the scan-integrated energy SE(x) in the field plane.

To influence the uniformity in the field plane in a preferred embodiment of the invention, the transmission of light from the object side to the image side of the collector is different for different mirror shells.

In an advantageous embodiment, said transmission can be varied by providing different coatings for the different mirror shells. Since the coatings have different reflectivity, the transmission of different mirror shell is different.

In a further embodiment, one can situate a filter element on the object side of the collector. The filter element has a different transmission for light received from different mirror shells. Alternatively, a filter element can be situated on the image side of the collector. In such a case, the transmission for light emerging from different mirror shells is different.

By changing and thus adjusting the transmission of different mirror-shells one can adjust the uniformity to a predetermined value in the field plane. In this application the transmission T is defined as the ratio of the energy flow $I_{energy\ flow\ entering\ a\ collector\ shell}$ which enters a mirror shell of the collector on the object side to the energy flow $I_{energy\ flow\ leaving\ a\ collector\ shell}$ which is leaves the collector on the image side:

$$T = I_{energy\ flow\ entering\ a\ collector\ shell} / I_{energy\ flow\ leaving\ a\ collector\ shell}$$

In addition to the collector and the illumination system, the invention also provides an EUV projection exposure system as well as a method for producing microelectronic components.

BRIEF DESCRIPTION OF THE DRAWINGS

The invention will now be described below by reference to examples shown in the drawings, wherein.

DESCRIPTION OF THE INVENTION

Figure 1:
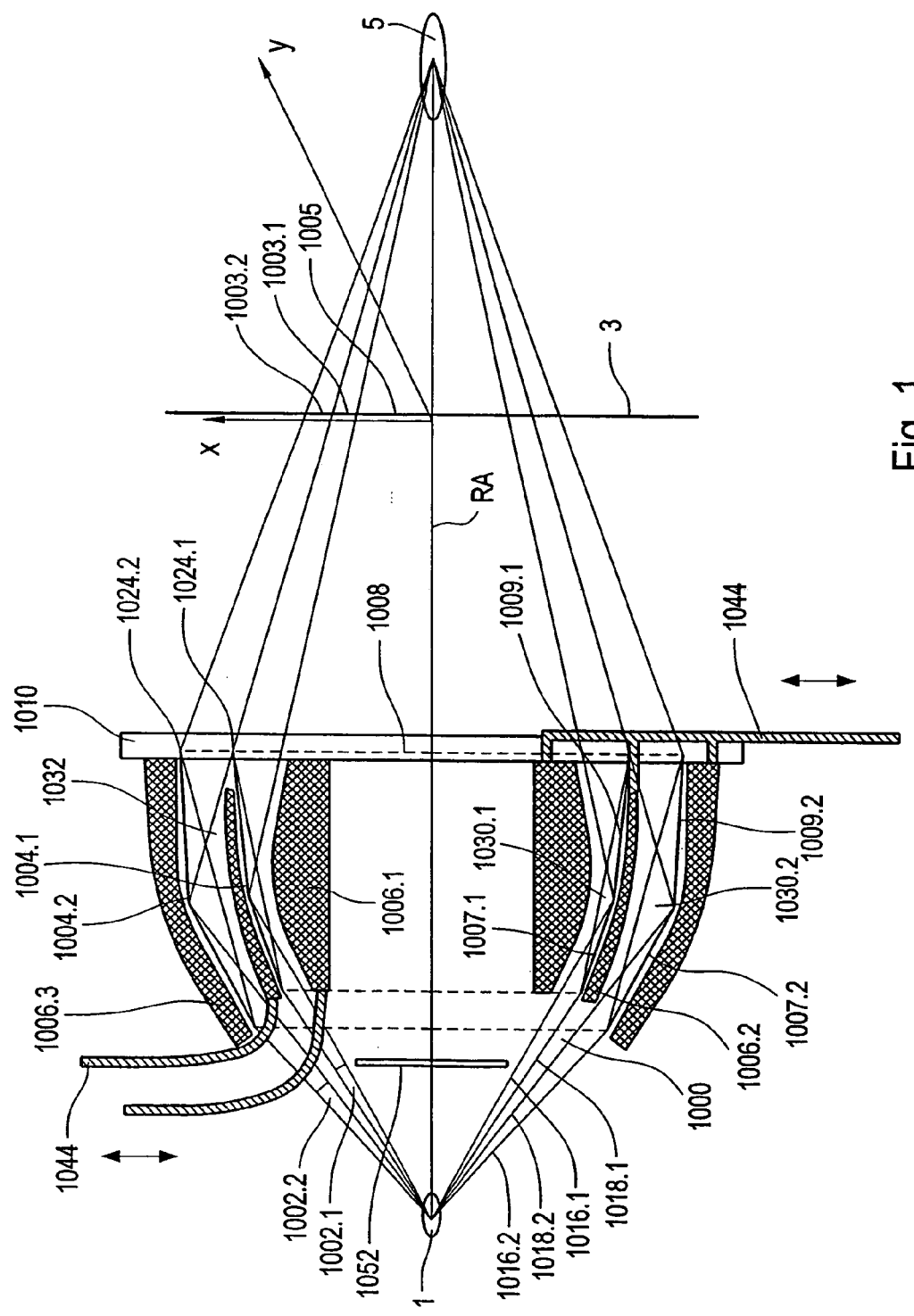
FIG. 1 shows a schematic diagram of a collector with a fastening device in accordance with the invention.

FIG. 1 shows an embodiment of a nested collector in accordance with the invention with two mirror shells 1004.1, 1004.2 which are arranged within each other and in which the ring aperture elements through which the light of the light source 1 is received by the collector have a gap 1000. The gap 1000 is shown between the object-side ring aperture elements 1002.1 and 1002.2 of the first mirror shell 1004.1 and the second mirror shell 1004.2. The ring elements 1003.1, 1003.2 on the image side, into which the light received from the light source 1 is guided, are directly adjacent, so that in the image space, i.e. in the plane to be illuminated on the image side, there is no gap with the exception of the central shading 1005. Cooling devices 1006.1, 1006.2, 1006.3 are arranged in the illustrated collector in the unused region between the two mirror shells 1004.1, 1004.2, furthermore outside the collector and inside the collector. The mirror shells 1004.1, 1004.2 end approximately in a plane 1008 and are mounted in this plane 1008 in accordance with the invention by a spoke wheel of which one spoke 1010 is shown. The first mirror shell 1004.1 as well as the second mirror shell 1004.2 of the illustrated embodiment comprises two mirror segments, namely a first mirror segment 1007.1, 1007.2 with a first optical surface and a second mirror segment 1009.1, 1009.2 with a second optical surface. The optical surface of the first mirror segment and the optical surface of the second mirror surface are arranged successively without a gap. The first mirror segments 1007.1, 1007.2 are in the present example segments of hyperboloids and the second mirror segments 1009.1, 1009.2 are segments of ellipsoids.

As is shown in the meridional sectional view in FIG. 1, the inner and outer edge beams 1016.1, 1016.2, 1018.1, 1018.2 of the respective mirror shell or the connecting lines associated with the same between the source 1, the image of source 5, the shell ends 1024.1, 1024.2 and in systems with two mirror segments additionally the transitional region between the first 1007.1, 1007.2 and the second mirror segment 1009.1, 1009.2 define an optically used region or a so-called beam-pipe through which the radiation flux flows from the object or from the light source 1 to the image 5 of the light source. A meriodional section or a meridional plane is the plane which comprises the rotational axis RA. An unused region 1032 is now situated between the used regions 1030.1, 1030.2 of at least two mirror shells 1004.1, 1004.2—the first mirror shell 1004.1 and the second mirror shell 1004.2—which are arranged within each other.

In the unused region 1032 between the first mirror shell 1004.1 and the second mirror shell 1004.2 it is possible to arrange further components of the nested collector without influencing the radiation flux from the light source 1 to the image of the light source 5. Examples for such components are detectors or outcoupling mirrors which deflect light to detectors or non-optical components such as heat shields or cold traps. Cooling devices 1006.1, 1006.2, 1006.3 can be in direct contact with the rear sides of the collector shells. The arrangement of electrodes or magnets for deflecting charged or magnetic particles is also possible. Electric conductors or conduits for feeding or removing coolant can only be provided in the case of slight shading of the collector aperture on the image side, i.e. the illuminated region in the image-side plane outside of the collector. Preferably, these lines 1044 are guided in the region of the shadows of the spokes 1010 of the spoke wheel. The spoke wheel is aligned in accordance with the invention in x-direction, i.e. perpendicular to the scanning direction. The shells of the nested collector per se are provided in an essential rotational symmetric manner about the rotational axis z. Obviously, further cooling elements or detectors can also be arranged in regions outside of the outermost shell 1004.2 or the central shading 1052. A diaphragm can also preferably be arranged in the region of the central shading.

If the collector in accordance with the invention as shown in FIG. 1 is used in an illumination system, the first optical element of the illumination system with first raster elements which are also designated as first field facets is arranged in or close to the plane 3 to be illuminated on the image side.

Grooves can be incorporated in the spokes of the spoke wheel, e.g. they can be cut in. The collector shells can be embedded in said grooves. In this way it is possible to mount the mirror shells with a fastening device in accordance with the invention, e.g. the mirror shells are glued in the groove. The fastening device is also denoted as holding device according to the invention.

Although the collector is described hereinabove exemplary as a nested collector having a first mirror shell 1004.1 and a second mirror shell 1004.2, the invention is not restricted to such a embodiment. For a person skilled in the art it is clear that the solution given hereinabove is valid for all types of nested collectors with a plurality of rotational symmetric mirror shells, e.g. a system with eight mirror shells.

Figure 2:
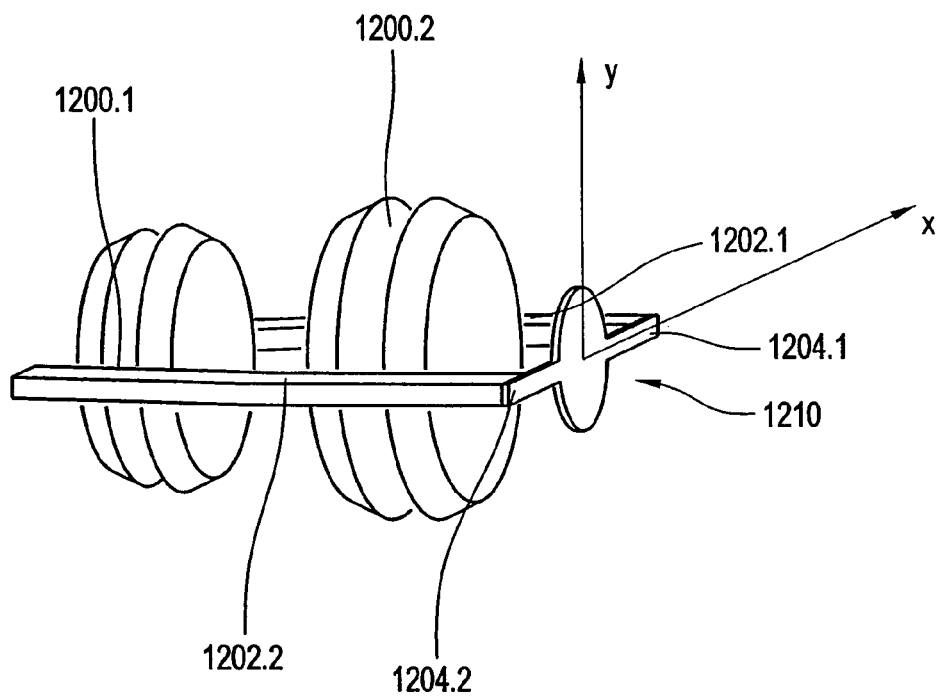
FIG. 2 shows a three-dimensional view of the fastening device of a shell of a collector in accordance with the invention with cooling rings and spokes and webs.

FIG. 2 shows a further development of the embodiment of the invention. In the embodiment shown in FIG. 2 the holding device is shown representatively for a single mirror shell. The holding device comprises two spokes 1204.1, 1204.2 in the x-y plane for holding the individual mirror shells and additional webs 1202.1, 1202.2. Each of the webs is fastened to a spoke of the spoke wheel. The webs contribute to the further mechanical stabilization of the collector. FIG. 2 further shows cooling devices for cooling the collector shell, which devices are arranged as cooling rings which run around the full circumference of the collector.

The cooling rings 1200.1 and 1200.2 are arranged in the unused region between two mirror shells of a collector with two segments per mirror shell for example. A Wolter collector with two mirror shells, a first mirror shell 1004.1 and a second mirror shell 1004.2, is shown in FIG. 1 for example in a meridional sectional view. The cooling rings 1200.1, 1200.2 are held on holding structures or webs 1202.1, 1202.2 which extend in the shadow of the spokes of the spoke wheel and extend in the direction of the rotational axis. The connection of the cooling rings 1200.1 and 1200.2 with the holding webs 1202.1, 1202.2 can be made via a soldered connection for example. This guarantees a favorable mechanical and thermal contact. The webs are preferably made of a material with favorable thermal conductivity, e.g. copper, and are easy to solder. The cooling rings 1202.1, 1202.2 are also preferably made of a material which favorable thermal conductivity such as copper or steel.

As already mentioned above, the holding webs 1202.1, 1202.2 are fastened to the two spokes 1204.1, 1204.2 of the spoke wheel which mounts and fixes the individual mirror shells, e.g. by means of screws. The spokes extend in the radial direction, i.e. in a direction perpendicular to the rotational axis and perpendicular to the scanning direction.

Figure 3:
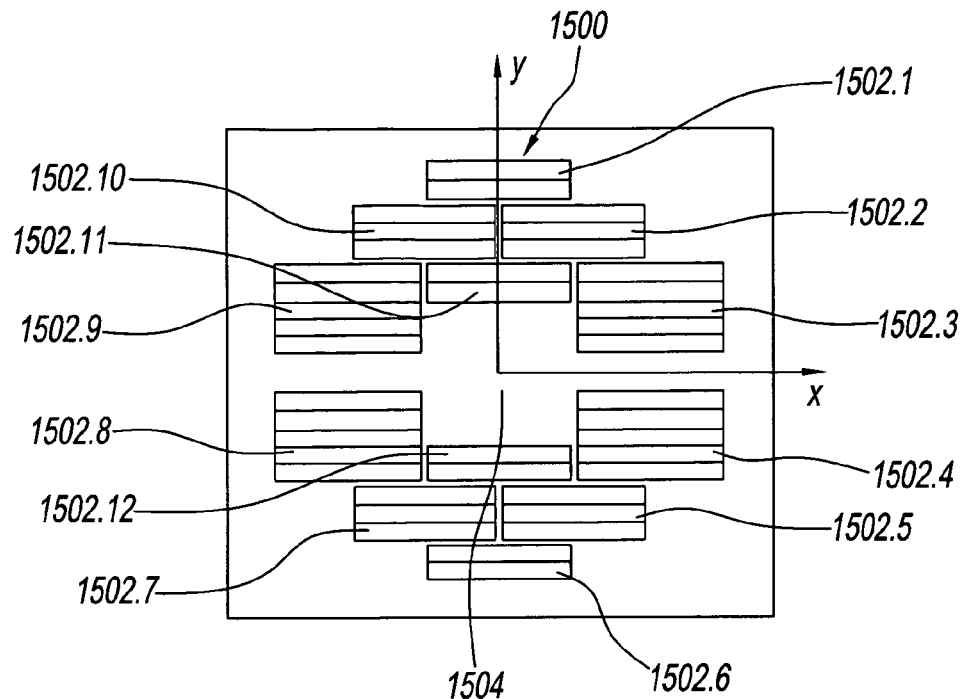
FIG. 3 shows a first element with raster elements which is arranged in the plane of the collector to be illuminated on the image side.
Figure 4:
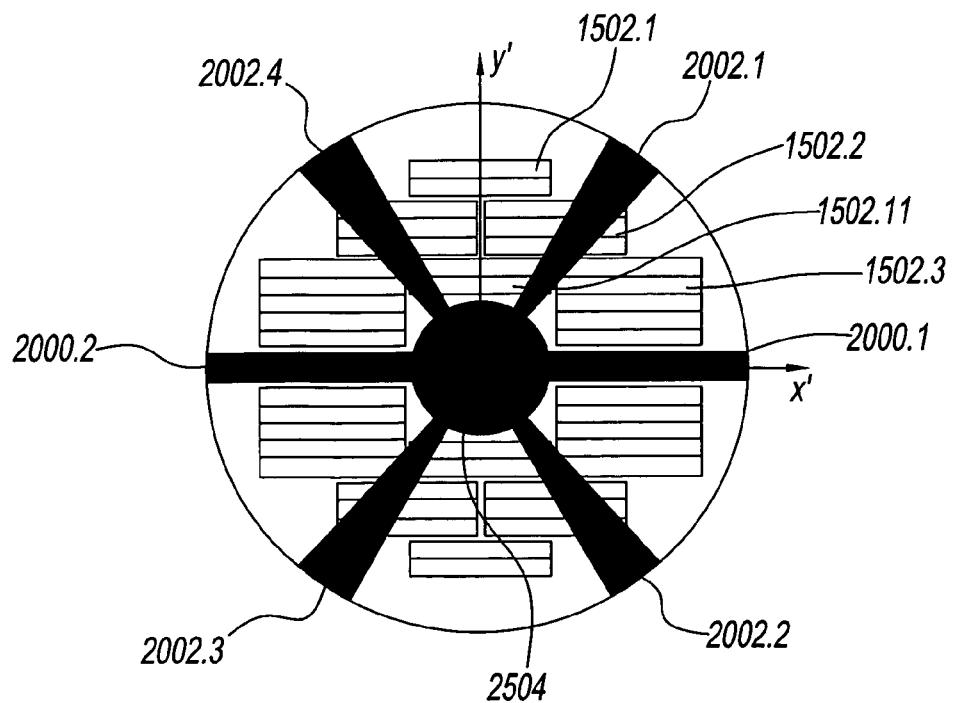
FIG. 4 shows a vignetting by the support spokes of a fastening device in accordance with the invention in the plane of the first optical element with first raster elements.

FIG. 3 shows the arrangement of the first raster elements which are designated as field facets on the first optical element with first raster elements which is arranged in the plane 3 to be illuminated by the collector. The first optical element with first raster elements is situated in a plane defined by the local x- and y-direction. The plane of the first optical element with first raster elements as defined by the local x- and y-direction does not stand perpendicular to the rotational axis of the collector and thus does not exactly correspond to the plane 3 of FIG. 1 to be homogeneously illuminated. Slight angles of inclination do not change anything substantially and only lead to a slight distortion of the illumination. The first raster elements 1500 are arranged in twelve mutually spaced blocks 1502.1, 1502.2, 1502.3, 1502.4, 1502.5, 1502.6, 1502.7, 1502.8, 1502.9, 1502.10, 1502.11, 1502.12. There are no raster elements 1500 in the region which is not illuminated by the central shading 1504 of the collector. Furthermore, no raster elements are arranged in the region of the first optical element with raster elements which is vignetted in the plane to be illuminated on the image side by spokes of the spoke wheel extending parallel to the x-direction. The vignetting in the plane to be illuminated in which the optical element with first field facets is arranged is shown in FIG. 4. FIG. 4 shows shadows of the spoke wheel which leads to the vignettings in the x'-y' plane of the first optical element. In particular, FIG. 4 shows two shadows 2000.1 and 2000.2 extending parallel to the x'-direction in the local plane of the collector as well as four further shadows 2002.1, 2002.2, 2002.3, 2002.4 which extend in a direction in the local x'-y' plane of the collector which is not parallel to the x'-direction. FIG. 4 also shows the shadow 2504 of the central shading of the collector.

As already mentioned above, the planes defined by the local x'- and y'-directions of the collector and the mirror with first raster elements do not coincide exactly. Instead they are mutually inclined relative to each other at low angles of inclination. This does not change anything substantially regarding the situation of the support spokes and leads only to minor distortions of the illumination. The first raster elements are also denoted as field raster elements or field facets.

The further supporting spokes are arranged in such a way that the shadows 2002.1, 2002.2, 2002.3, 2002.4 as is caused by them in the x'-y' plane in which the first raster elements are arranged will shadow the individual first raster elements at different locations. As a result, the field facets of block 1502.2 for example are shadowed substantially in the middle, whereas the field facets of the blocks 1502.11 are merely shadowed at the edge and in the block 1502.3 merely one is shadowed at the edge out of the four field facets.

No field facet is shadowed in the block 1502.1. Since in the present case the blocks of the first raster elements are arranged on the first optical element in a manner symmetrical both with respect to the y'-axis as well as x'-axis, the same considerations apply with respect to the blocks which are symmetrical to the blocks 1502.1, 1502.2, 1502.3 and 1502.11. Since, as was already explained above, the individual field facets (when symmetries are not considered) are vignetted by the support spokes at different locations in the plane to be illuminated in which the optical element is arranged, the loss of light by these shadings of the support spokes in the field plane in which the images of all field facets are mutually superimposed will substantially average themselves out, so that as a result of the arrangement in accordance with the invention the uniformity of the illumination i.e. the scan integrated energy of the field in the field plane is influenced only to an very low extent. This is explained in closer detail with reference to FIGS. 11 and 12a to c.

As is shown by the shape of the shadings in the plane to be illuminated, the spokes of the spoke wheel which do not extend parallel to the x'-axis are arranged (as shown in the illustrated embodiment) in a manner tapering in the direction towards the rotational axis of the collector. The rotational axis of the collector is situated in the region of the central shading. This leads to the advantage that relating to the circumference a similar amount of light is shaded on each shell.

Figure 5A:
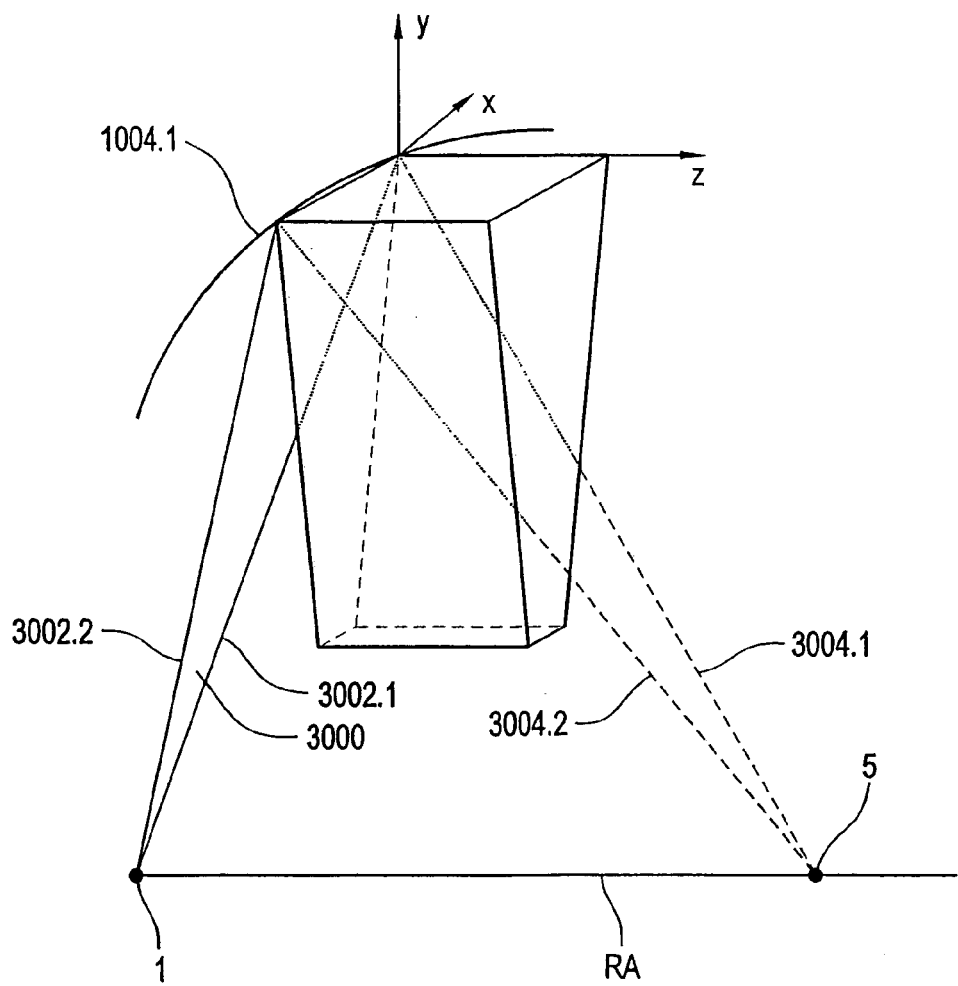
FIG. 5a shows a three-dimensional view of a first embodiment of a spoke of a holding device.
Figure 5B:
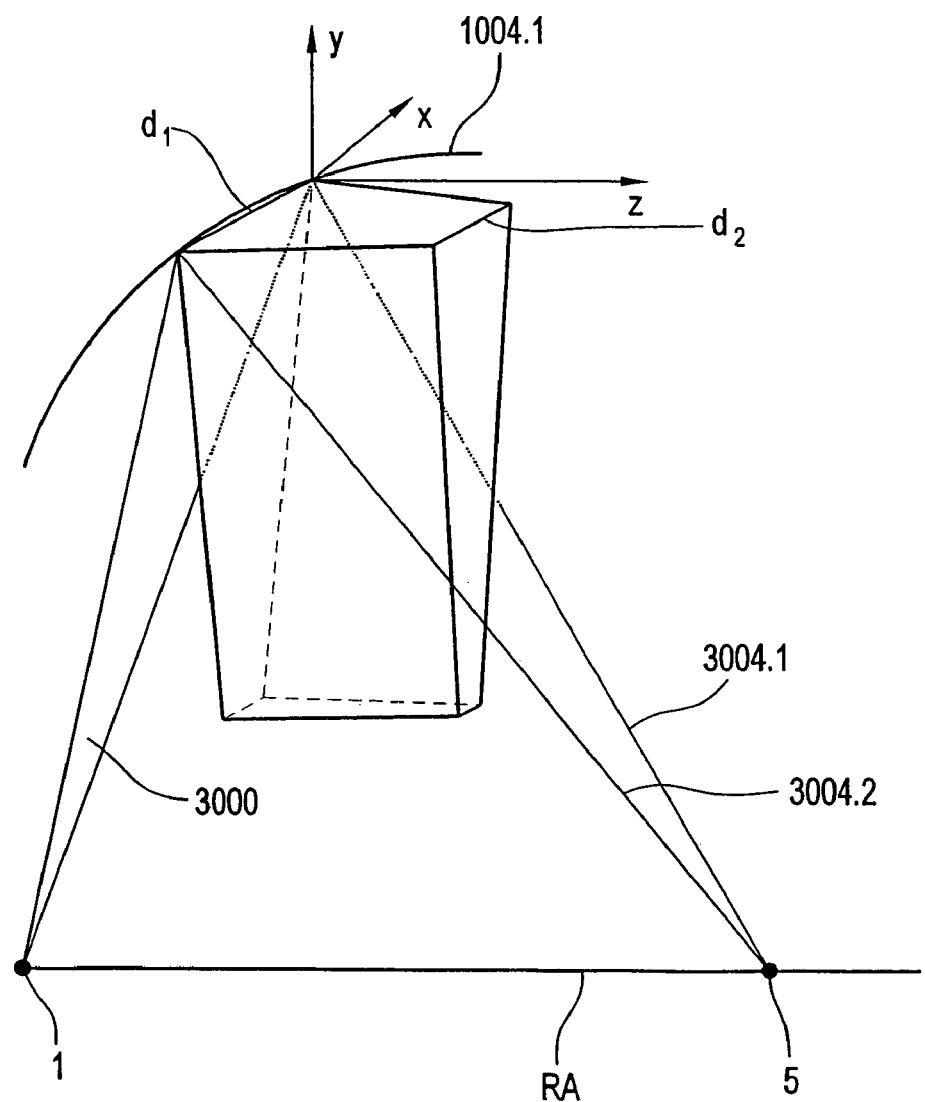
FIG. 5b shows a three-dimensional view of a second embodiment of a spoke of a holding device.

FIGS. 5a and 5b show a single spoke of the holding device as shown in FIG. 2 in a three-dimensional view. An x-, y-, z-coordinate system is shown, with the spoke having an extension in the z-direction along the direction of the common rotational axis RA of the plurality of mirror shells. The drawing further shows the light source 1 as well as a mirror shell or the first the mirror shell 1004.1 of the collector according to FIG. 1 and the beam path of a beam of rays 3000 from the light source 1 to the source image 5. Both in the embodiment according to FIG. 5a as well as 5b the spoke shows in the x-y sectional view a shape tapering in the radial direction as described in FIG. 4.

If the spoke (as is described in FIG. 5a) is not provided with a tapering configuration, the boundary rays 3002.1, 3002.2 of a beam of rays 3000 which are reflected from the collector shell 1004.1 are vignetted, with the collector shell 1004.1 being fastened to a groove (not shown) of the spoke. The boundary rays 3002.1, 3002.2 of the beam of rays are defined by the extension of the spoke in the x-direction for the respective mirror shell.

The boundary rays 3004.1, 3004.2 which are reflected and vignetted on the mirror shell 1004.1 by a spoke extending in the z-direction are shown in FIG. 5a in a dot-dash line.

If (as is shown in FIG. 5b) the spoke is provided with a tapering arrangement in the direction of the propagation of the light, i.e. in the z-direction, a shading of the boundary rays 3004.1, 3004.2 of the beam of rays 3000 as reflected by the mirror shell 1004.1 can be avoided. The boundary rays are defined as in FIG. 5a. In the case of a tapering arrangement as shown in FIG. 5b, the spoke tapers in the profile from the object-side aperture which receives the light of the light source 1 to the image-side aperture in which the light is guided in the direction towards the plane 3 to be illuminated and the image of the light source 5. In the profile, the spoke shows a thickness $d_1$ in the region of the object-side aperture and a substantially lower thickness $d_2$ on the exit-side end of the collector.

Figure 6:
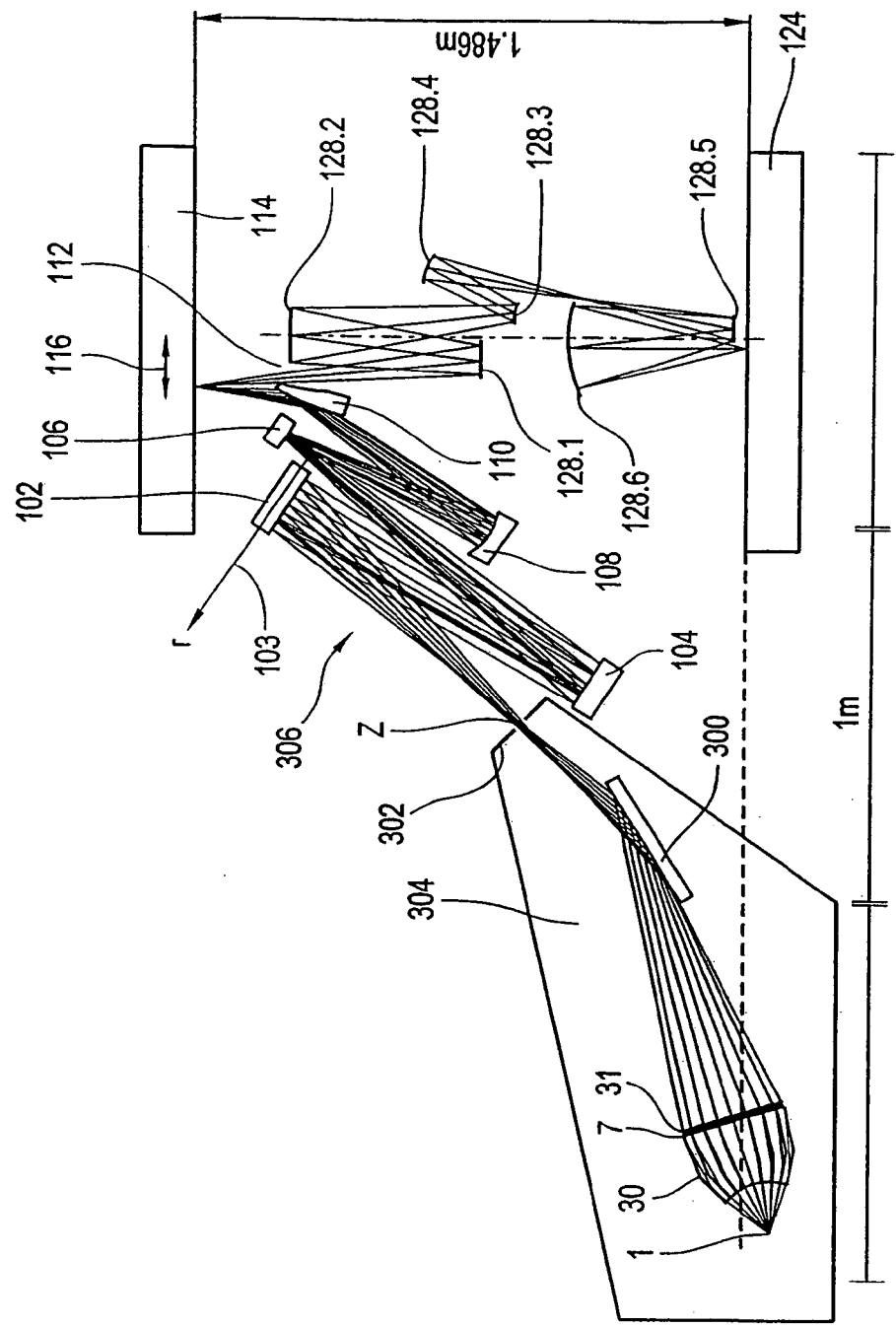
FIG. 6 shows a schematic diagram of a projection exposure apparatus for the production of microelectronic components.

FIG. 6 shows a schematic view of a projection exposure apparatus for the production of microelectronic components for example in which the invention may be used.

The projection exposure system as shown in FIG. 6 comprises a light source 1 as well as a nested collector 30 with 8 shells for illuminating a plane 103. Also depicted in FIG. 6 is a filter element 31 in the light path from the light source 1 to the object plane downstream the collector 30. With such a filter element the transmission of the different mirror shells can be changed, e.g. that the transmission of a inner mirror shell is higher than the transmisson of an outer mirror shell. In this application the transmission T of a mirror shell is defined as the ratio of the energy flow $I_{energy\ flow\ entering\ a\ collector\ shell}$ which enters a mirror shell of the collector on the object side to the energy flow $I_{energy\ flow\ leaving\ a\ collector\ shell}$ which is leaves the mirror shell of the collector on the image side. The filter can also be situated at the object side of the collector, this means between the light source 1 and the collector 30. Also two filter elements on the object side as well as on the image side of the collector 30 would be possible. A filter element 31 for a nested collector in the x-y-plane is shown in more detail in FIG. 7A.

Figure 7A:
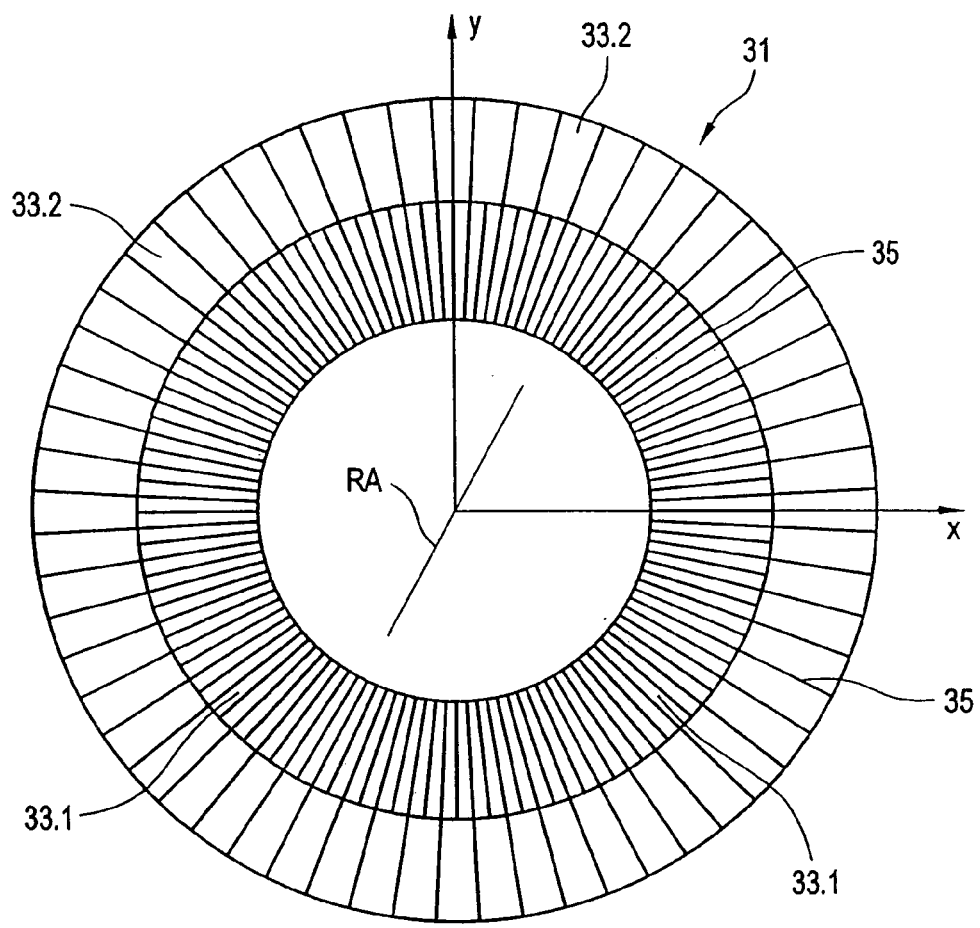
FIG. 7A shows an example for a filter element for a nested collector with two mirror shells

The filter element depicted in FIG. 7A is depicted as a filter element for two shells of a nested collector 30. The filter area for the first shell is denoted with reference number 33.1, the filter area for the second shell is denoted with reference number 33.2. Both filter areas are essentially of round shape in the x-y-plane, since they are rotational symmetric about an rotational axis RA, as the mirror shells of the nested collector. Each of the filter elements can comprises wires 35. The density of the wires 35 is different for the filter areas 33.1, 33.2 for the first and the second mirror shell. By varying the density of the wires of the filter areas 33.1, 33.2 for the first and the second mirror shell, the transmission for the different mirror shells can be changed.

Figure 7B:
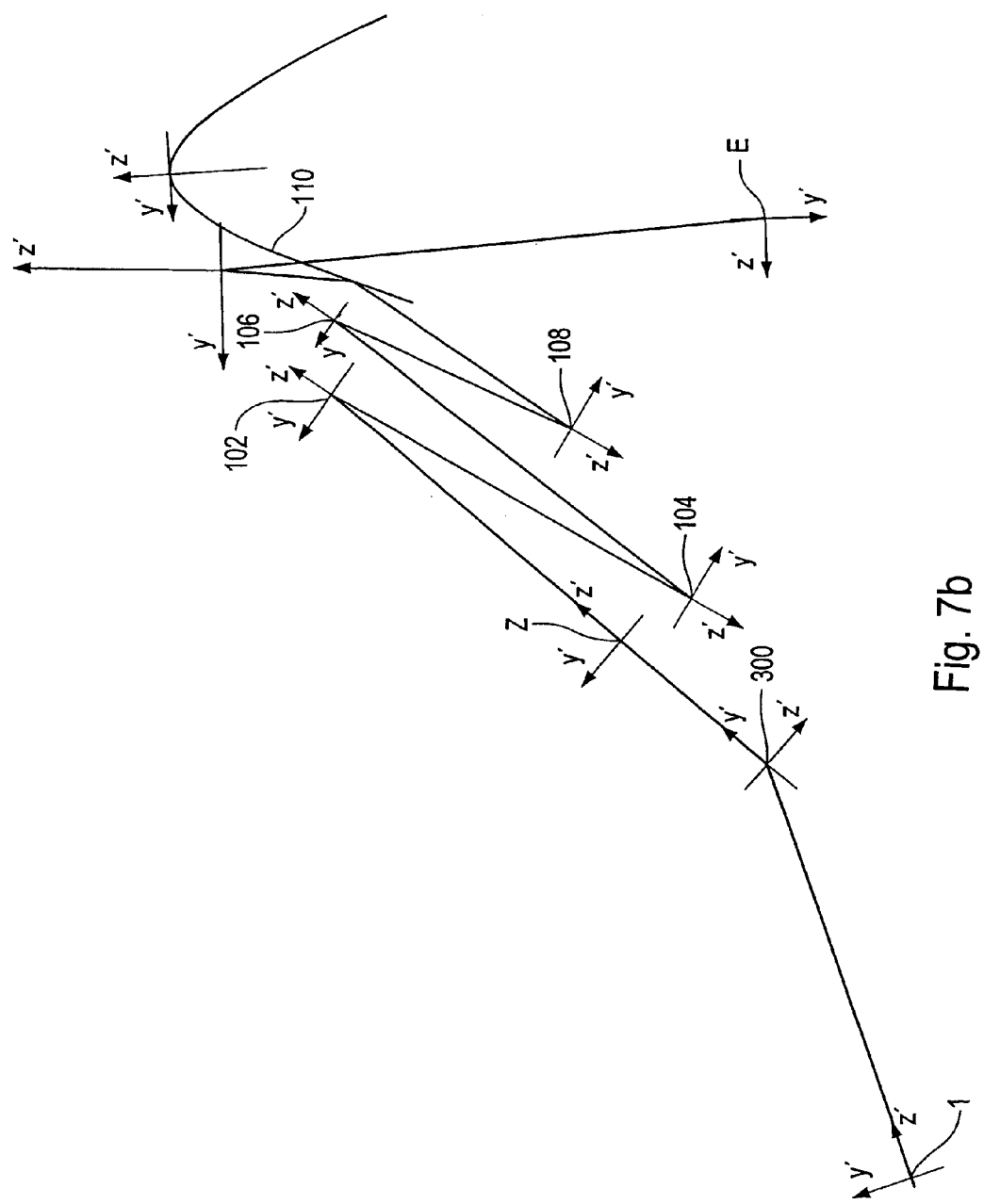
FIG. 7B shows a system of coordinates of all optical components of the illumination system of the EUV projection exposure apparatus pursuant to FIG. 6.
Figure 8:
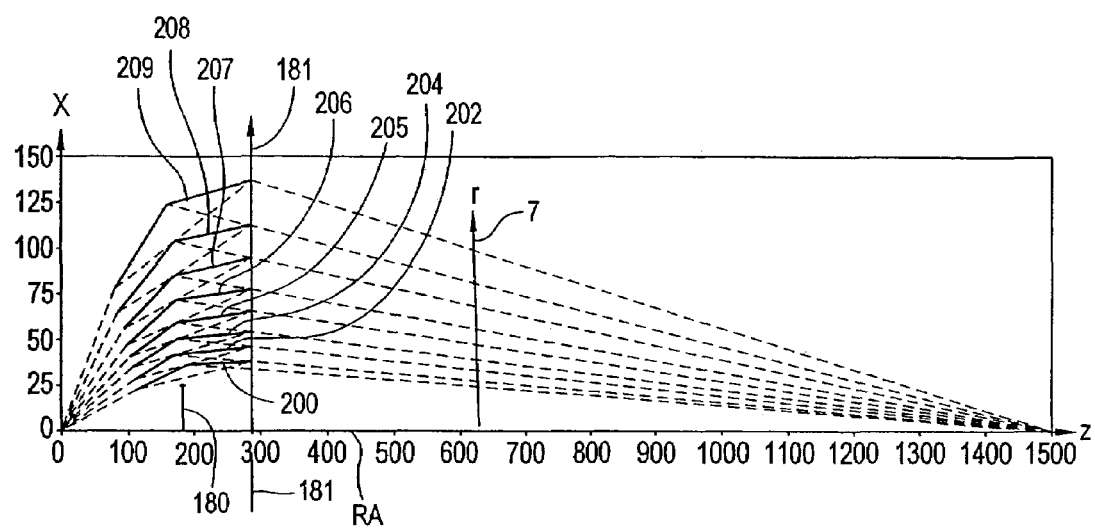
FIG. 8 shows an 8-shell nested Wolter system.
Figure 9:
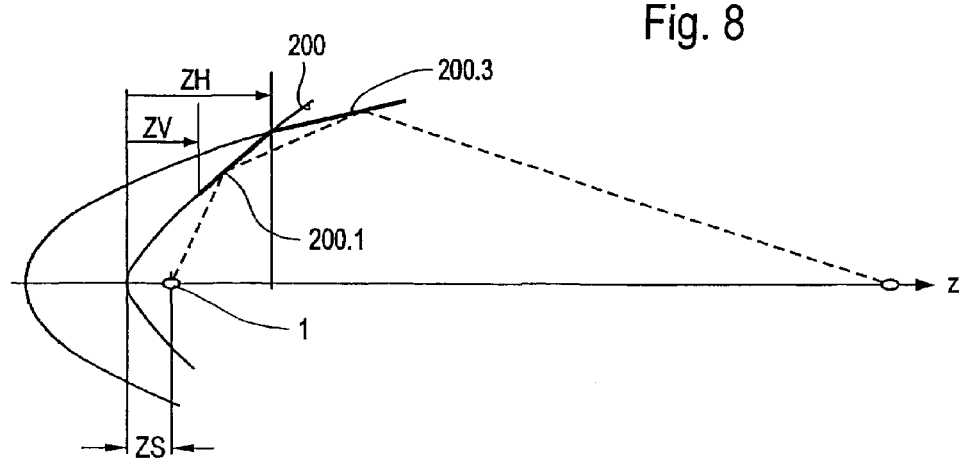
FIG. 9 shows a diagram for explaining the coordinates of a collector shell designed as a collector system with two reflections.

The configuration of the collector is shown in FIGS. 8 and 9 and the data are shown in table 2. The plane mirror 300 in the beam path between the nested collector and before the intermediate focus Z can be configured as a spectral filter with a diffraction angle of 2° between $0^{th}$ and used diffraction order. The first optical element 102 comprises in one embodiment 122 first raster elements with an extension of 54 mm×2.75 mm each. The second optical element 104 comprises 122 of second raster elements which are associated to each of the 122 raster elements and which have a diameter of 10 mm each. The optical elements 106, 108 and 110 are substantially used to shape the field in the object plane 114. All information of the optical components in table 1 relate to the reference coordinate system in the object plane 114 of the projection exposure system. A structured mask (not shown) is situated in the object plane 114 which is projected by means of a projection lens 126 onto the object to be exposed in the plane 124. The rotation about the angle α about the local x-axis of the local coordinate systems associated with the respective optical component is obtained after a translatory displacement of the reference coordinate system to the place of the local coordinate system. The parameters of the optical components of the illumination system of the projection exposure system according to FIG. 6 are stated in table 1. The illumination system of the projection exposure system as shown in FIG. 6 comprises all optical components which are situated in the light path from the light source 1 to the object plane 114. The illumination system is in principle a double-faceted illumination system as disclosed in U.S. Pat. No. 6,198,793 B1, the content of this patent is included by reference in this application. Table 1 states the positions of the vertices of the individual optical elements relating to the object plane 114 and the rotational angles a of the coordinate systems about the x-axis. Right-handed coordinate systems and clockwise rotation are further used. In addition to the local coordinate systems of the optical components, the local coordinate systems of the intermediate focus Z and the entrance pupil E are stated. The field-forming mirror 110 consists of an off-axis-segment of a rotational hyperboloid. The coordinate systems for all optical elements (as described in table 1) of the illumination system of the projection exposure system according to FIG. 6 (with the exception of collector 30) are shown in FIG. 7B. All optical elements are provided with the same reference numerals as in FIG. 6.

The system is designed for a field radius of 130 mm with an illumination aperture of NA=0.03125 in the object plane 114, i.e. on the reticle, according to a filling degree of σ=0.5 in the entrance pupil E of a subsequent 4:1 projection objective with an aperture NA=0.25 in the plane 124 of the object to be exposed.

The reticle can be moved as shown in direction 116 in the projection exposure system which is designed as a scanning system.

Figure 10:
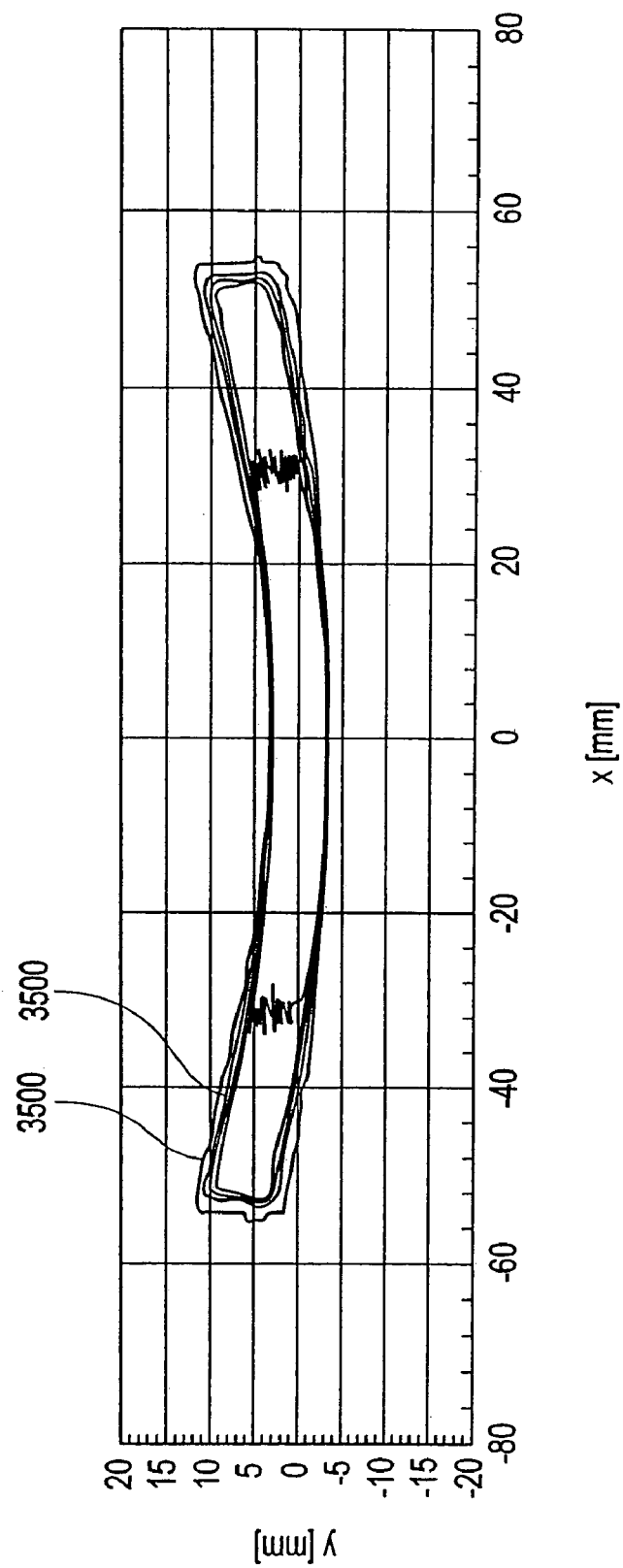
FIG. 10 shows the superposition of the images of the first raster elements in the field plane.

The exit pupil of the illumination system is illuminated in a substantially homogeneous manner. The exit pupil coincides with the entrance pupil E of the downstream projection objective 126. The entrance pupil is located at the point of the intersection of the principal ray of the central field point (0,0) with the optical axis of the projection objective. The principal ray is reflected by the reticle. The central field point (0,0) of the field illuminated in the field plane is shown in FIG. 10.

The projection objective 126 comprises six mirrors 128.1, 128.2, 128.3, 128.4, 128.5, 128.6 for example according to the U.S. patent application Ser. No. 09/503,640 and now U.S. Pat. No. 6,353,470. The projection objective 126 projects the reticle in the object plane 114 onto the object 124 to be exposed.

Table 1: Design data of the illumination system of the projection exposure system according to FIG. 6.

| Position | Y | Z | □ | Bending radius at vertex | Conical constant |
|---|---|---|---|---|---|
| Light source 1 | 2148.137 | −1562.205 | 70.862 | -no mirror surface- | |
| Plane mirror or spectral filter 200 | 1184.513 | −1227.797 | 147.434 | Plane | |
| Intermediate focus Z | 883.404 | −893.382 | 42.000 | -no mirror surface- | |
| First faceted optical element 102 | 302.599 | −248.333 | 36.000 | −898.54 | Spherical |
| Second faceted optical element 104 | 773.599 | −1064.129 | 214.250 | −1090.15 | Spherical |
| Mirror 106 | 126.184 | −250.216 | 31.500 | 288.1 | Spherical |
| Mirror 108 | 372.926 | −791.643 | 209.600 | −855.8 | Spherical |
| Vertex of mirror 110 | −227.147 | 118.541 | −4.965 | −80.5 | −1.1485701 |
| Object plane 114 | 0.000 | 0.000 | 0.000 | Plane | |
| Entrance pupil E | −130.000 | −1236.857 | 0.000 | -no mirror surface- | |

In order to reduce the system length, the image-side aperture of the nested collector 30 which has a structure as in FIG. 8 is increased to NA=0.115. For such a collector, the configuration as a Wolter system is especially advantageous. The aperture on the object side is NA~0.71. A plane mirror 300 for folding the system is inserted in addition after the collector 30 in order to provide construction spaces for mechanical and electronic components in the object plane 114 in which the wafer stage is situated. The entire optical system is less than 3 m long and less than 1.75 m high.

The plane mirror 300 is configured in the present embodiment as a diffractive spectral filter, i.e. it is realized by a grating. In combination with the diaphragm 302 situated close to the intermediate image Z of the source it is thus possible to prevent radiation with wavelengths for example which are substantially higher than the desired wavelength (which in the present case is 13.5 nm) from entering the part of the illumination system which is situated in the light path downstream the diaphragm 302.

The diaphragm 302 can also be used to spatially separate the space 304 which comprises the light source 1, the nested collector 3 as well as plane mirror 300 which is configured as a grating from the downstream illumination system 306. If both spaces are separated by the introduction of a valve close to the intermediate focus Z, a separation by pressure is also possible. A spatial or pressure separation can prevent that impurities caused by the light source will reach the illumination system situated behind the diaphragm 302.

The collector 30 of the projection illumination system according to FIG. 6 is shown in FIG. 8 and has a distance of 1500 mm between source 1 and the intermediate image of source Z, an aperture of ~0.72 on the object side and an aperture of ~0.115 on the image side. The angle of incidence relative to the surface tangent of the maximum ray in the embodiment according to FIG. 8 is 11.9°.

FIG. 8 further shows a diaphragm 180 which is disposed in the interior of the innermost mirror shell. Nested reflective collectors necessarily comprise a central shading due to the finite size of the mirror shells, i.e. below a certain aperture angle $NA_{min}$ the radiation of the source cannot be received. The diaphragm 180 ensures that light, which is not reflected by the first mirror shell and directly travel through the mirror shell from the object-side to the image-side will not reach the downstream illumination system as stray light.

The diaphragm 180 is situated 78 mm behind the source for example and has a diameter of 30.3 mm according to an aperture obscuration of $NA_{obs}$~0.19. The aperture obscuration on the image side is accordingly $NA'_{obs}$~0.0277.

The characteristic coordinates of a Wolter system comprising two segments, e.g. a first segment 200.1 and a second segment 200.3 of a first mirror shell 200, are shown in FIG. 9 in an exemplary manner for the mirror shells 200, 202, 204, 205, 206, 207, 208, 209 of the collector according to FIG. 8. ZS designates the z-position of the surface vertex relating to the position of the light source 1. ZV and ZH relate to the initial and end position of the first segment 200.1, which is a hyperboloid, relating to the position of the surface vertex ZS. The reference numerals ZS, ZH and ZV are used in an analogous manner for the second segment 200.3 of the mirror shell which is an ellipsoid.

The design data of the collector according to FIG. 8 are obtained from the following table with the radii of curvature R and the conical constant K of the respective mirror segment and the given definitions. Ruthenium was chosen as the coating for the mirror shells.

Table 2: Design data of the collector according to FIG. 8

| Shell | R [mm] | K | ZS [mm] | ZV [mm] | ZH [mm] |
|---|---|---|---|---|---|
| | Hyperboloid | | | | |
| 1 | 1.5866 | −1.0201 | −0.79 | 108.99 | 185.86 |
| 2 | 2.3481 | −1.0286 | −1.17 | 107.92 | 183.90 |
| 3 | 3.5076 | −1.0399 | −1.74 | 107.56 | 182.35 |
| 4 | 5.0414 | −1.0571 | −2.49 | 105.05 | 179.53 |
| 5 | 7.2534 | −1.0814 | −3.56 | 102.83 | 177.68 |
| 6 | 10.4354 | −1.1182 | −5.07 | 99.95 | 175.90 |
| 7 | 15.0523 | −1.1755 | −7.22 | 94.87 | 173.09 |
| 8 | 22.3247 | −1.2660 | −10.50 | 88.88 | 169.39 |
| | Ellipsoid | | | | |
| 1 | 2.3724 | −0.9971 | −160.94 | 349.66 | 433.46 |
| 2 | 3.3366 | −0.9960 | −168.17 | 353.68 | 440.17 |
| 3 | 4.6059 | −0.9945 | −181.56 | 363.50 | 454.10 |
| 4 | 6.4739 | −0.9923 | −184.74 | 364.03 | 457.33 |
| 5 | 9.0813 | −0.9893 | −189.80 | 366.19 | 463.15 |
| 6 | 12.8589 | −0.9849 | −193.20 | 365.14 | 466.03 |
| 7 | 18.4682 | −0.9783 | −195.28 | 362.33 | 470.02 |
| 8 | 26.8093 | −9688 | −202.36 | 362.94 | 480.72 |

The embodiment of the Wolter system according to FIG. 8 with eight shells is chosen in such a way that all shells end approximately in one plane 181. In this way all shells can be mounted in one plane 181.

The support spokes in accordance with the invention are used for holding the shells. The support spokes provide stability to the nested collector with a plurality of mirror shells.

FIG. 10 shows the superposition in the field plane of the images of the first raster elements which are also designated as field facets. The superposition of the images 3500 of the first raster elements lead to an annular field in the field plane. The field plane is defined by an x-direction and a y-direction. Here the y-direction is parallel to the scanning direction and the x-direction is perpendicular to the scanning direction of a scanner-type projection exposure system. The central field point (0,0) is the origin of the x-y-coordinate system shown in FIG. 10. An intensity I(x,y) is assigned to each field point in the x-y plane. A characteristic variable for scanner-type projection exposure systems is the scanning integrated energy SE(x) in the scanning direction, i.e. the scanning energy integrated in the y-direction.

The scan-integrated energy SE(x) is obtained for a field with an intensity distribution I(x,y) by integrating the intensity distribution in the scanning direction, i.e.:

$$SE(x)=\int I(x,y)dy.$$

The uniformity error is given by $$\Delta SE = \frac{SE_{max} - SE_{min}}{SE_{max} + SE_{min}}$$

with $SE_{max}$ or $SE_{min}$ designating the maximum or minimum value of the scan-integrated energy SE(x) within the illuminated field having an extension in the x- and y-direction and a shape as shown in FIG. 10.

The uniformity error $\Delta SE(x)$ is a characteristic value for a scanner-type projection exposure apparatus. If the uniformity error $\Delta SE(x)$ is low, the so-called uniformity of the system in the field plane is high. Projection exposure systems with a high uniformity in the field plane are especially advantageous.

Figure 11:
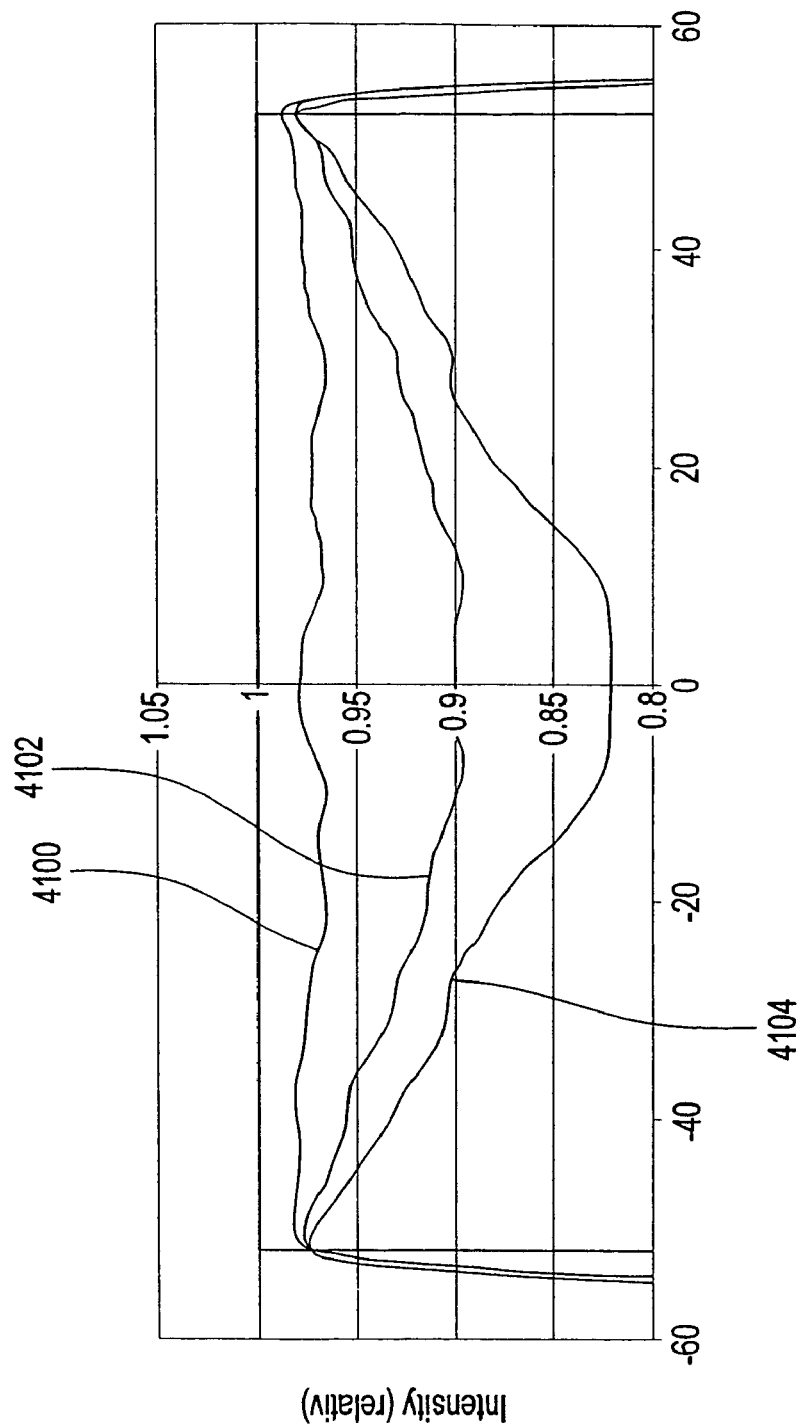
FIG. 11 shows the course of the scan-integrated energy SE(x)

FIG. 11 shows the scan-integrated energy SE(x) for a field as shown in FIG. 10 dependent on the x-position. The x-position is also called field height. In a scanner-type system the x-direction is perpendicular to the scanning direction. In FIG. 11 the scan-integrated energy SE(x) is given as a function of the field height x in units of %/mm as a relative power density. From the absolute intensity I(x,y) one gets the relative intensity by a simple renormalization.

$$I_N(x, y) = \frac{100}{N} I(x, y)$$

wherein $$N = \iint_{ring} dx dy I(x, y).$$

In this notation the total power content of a ring field is then equivalent to 100%. The normalized scanning integrated energy is then given by:

$$SE_N(x)=\int dy I_N(x, y).$$

Figure 12A:
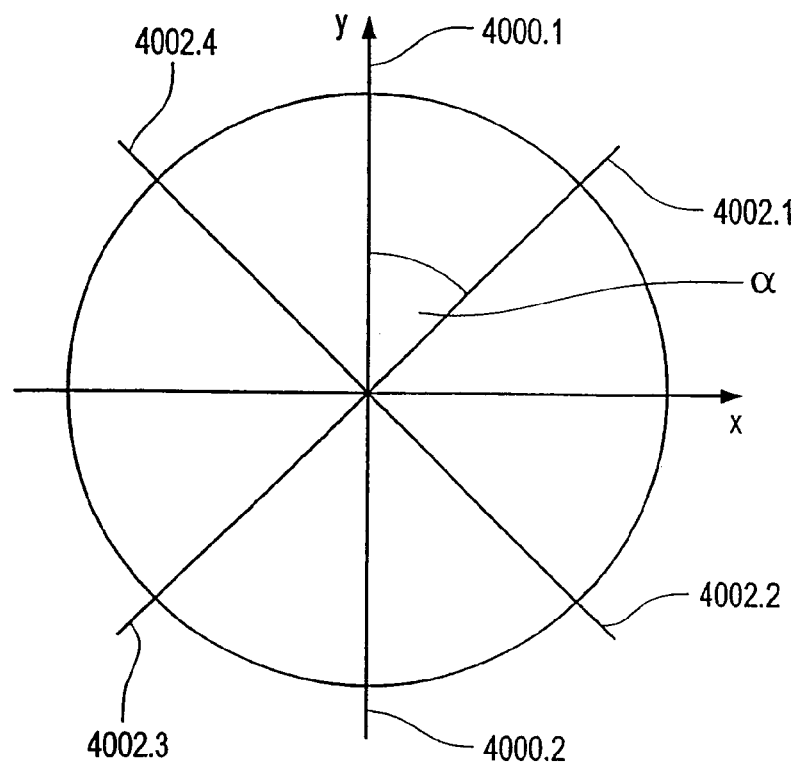
FIGS. 12a–12c show different arrangements of the spokes in the x-y plane.

Curve 4100 is obtained for the scan-integrated energy SE(x) in the field plane when the collector has a total of six spokes, with two spokes extending perpendicular to the x-direction and four spokes extending under an angle of 45 degrees to the x-direction. A top view in the local x-y plane of such a collector is shown in FIG. 12a. Reference numerals 4000.1 and 4000.2 designate the two spokes extending in the y-direction and reference numerals 4002.1, 4002.2, 4002.3, 4002.4 designate the four spokes inclined by an angle $\alpha=45°$ relative to the y-direction. The uniformity error $\Delta SE(x)$, as defined above, is merely 1.5%.

Figure 12B:
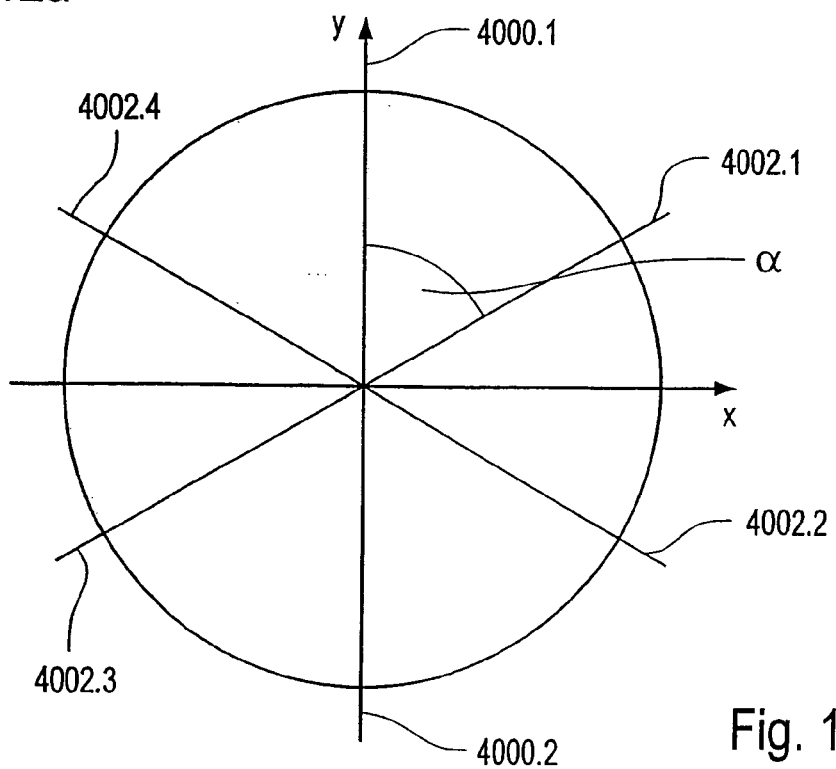

Reference numeral 4102 designates the scanning energy SE(x) in the field plane in the case that the collector comprises six spokes, with two spokes 4000.1, 4000.2 extending in the y-direction and the four spokes 4002.1, 4002.2, 4002.3, 4002.4 being inclined under an angle of 80° relative to the y-axis. Such an arrangement is shown in FIG. 12b. The uniformity error $\Delta SE(x)$ is in such a case 4.6%.

Figure 12C:
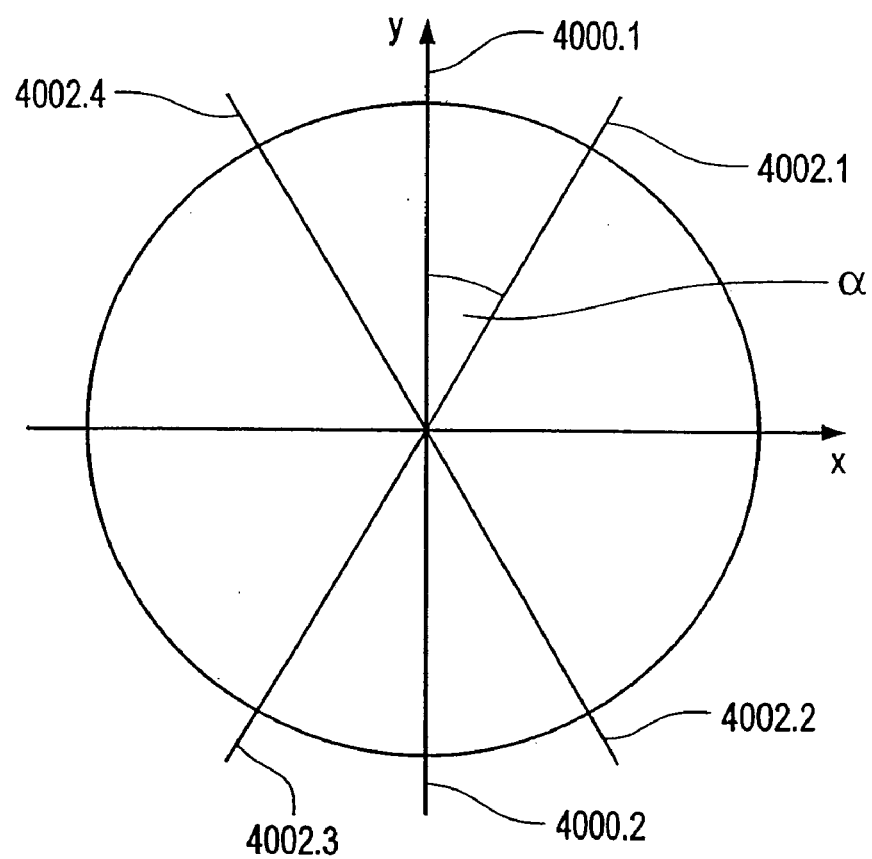

Reference numeral 4104 designates the progress of the scanning energy SE(x) in the field plane in the case that the collector comprises six spokes, with two spokes 4000.1, 4000.2 extending in the x-direction and the four spokes 4002.1, 4002.2, 4002.3, 4002.4 being inclined under an angle of 30° relative to the y-axis. Such an arrangement is shown in FIG. 12c. The uniformity error $\Delta SE(x)$ is in such a case 8.3%. As is shown from the previous example, the uniformity of the illumination in the field plane can be influenced by the arrangement of the support spokes.

In all cases the local coordinate system in the collector plane substantially coincides with the local coordinate system of the first optical element with first raster elements as is shown in FIG. 3 for example. The first raster elements are also denoted as field facets.

In the above described embodiment the invention provides for the first time a collector with a fastening device for a plurality of rotational symmetrical mirror shells, wherein the collector on the one hand has a high stability and on the other hand provides as a result of the arrangement of the spokes a low uniformity error $\Delta SE(x)$. Therefore field illumination in the field plane in which a mask or reticle is arranged is influenced only to a very low extent.

To further improve the uniformity of the scanning integrated energy SE(x) in the field plane in a further embodiment of the invention the transmission of the different mirror shells can be varied.

Figure 13:
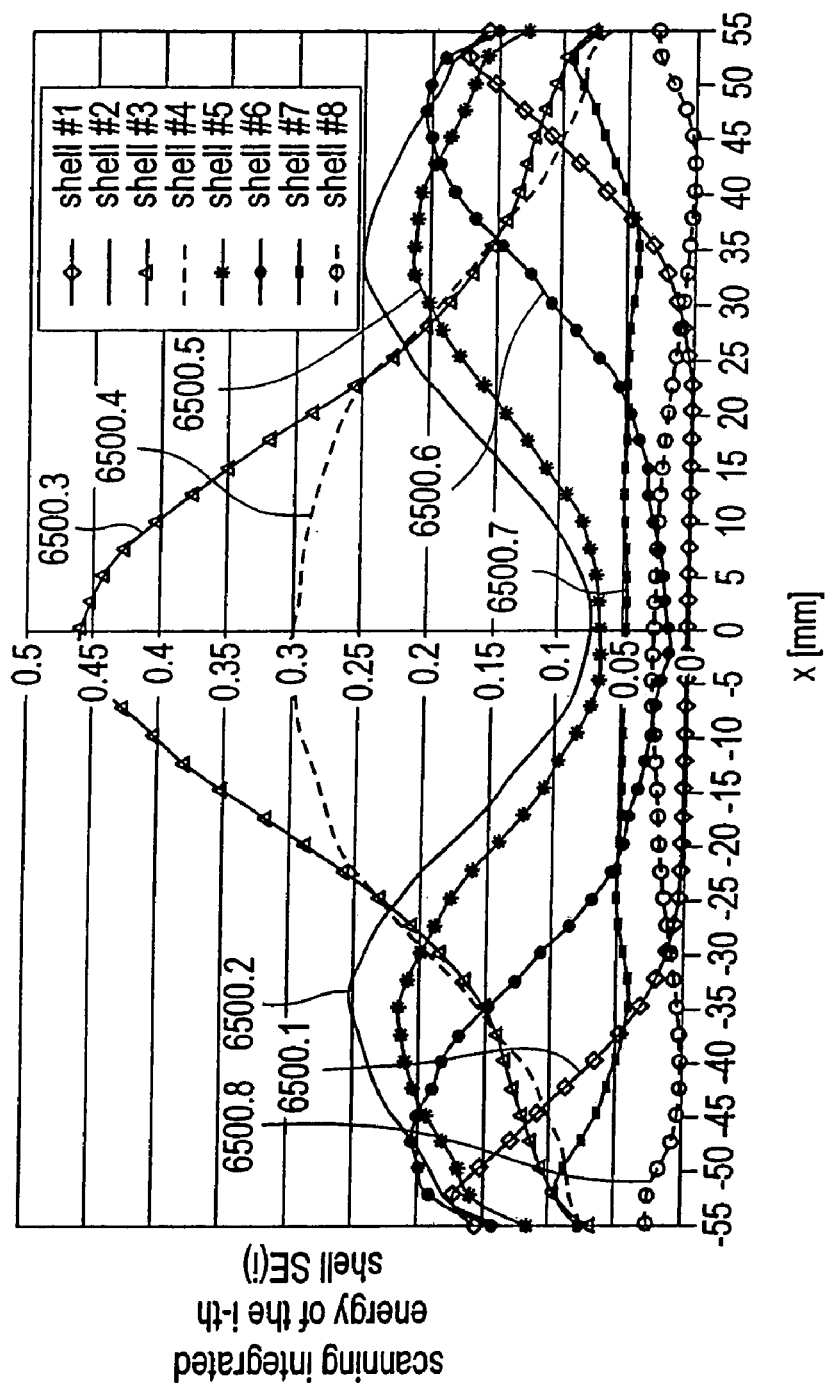
FIG. 13 shows the scanning-integrated energy for different mirror shells in the field plane.

FIGS. 13 show the scanning integrated energy contributions $SE^i$ for the different mirror shells i for a collector with eight mirror shells in total. The scanning integrated energy contributions $SE^i$ for the different mirror shells i are denoted by different symbols and reference numbers. Reference number 6500.1 denotes the scanning integrated energy distribution for the first mirror shell, reference number 6500.2 denotes the scanning integrated energy distribution for the second mirror shell, reference number 6500.3 denotes the scanning integrated energy distribution for the third mirror shell, reference number 6500.4 denotes the scanning integrated energy distribution for the fourth mirror shell, reference number 6500.5 denotes the scanning integrated energy distribution for the fifth mirror shell, reference number 6500.6 denotes the scanning integrated energy distribution for the sixth mirror shell, reference number 6500.7 denotes the scanning integrated energy distribution for the seventh mirror shell and reference number 6500.8 denotes the scanning integrated energy distribution for the eight mirror shell.

In the example, the scanning integrated uniformity is determined by the spatial intensity distribution at the optical integrator, in this case in the plane of first raster elements or field facets. The intensity distribution impinging on the first raster elements is segmented by the first raster elements and superposed at the field plane to illuminate the reticle. If the intensity distribution changes at the first raster elements, also the intensity distribution at the field plane and thus the scanning integrated uniformity might change. The different collector shells contribute to different areas of the intensity distribution at the first raster element plane and thus to different scanning integrated energy curves. Off course, the curves shown in FIG. 13 depend also on the specific arrangement and number of first raster elements of this example. All curves are normalized to a specific exemplary design layout.

One can see that the contribution of each shell has a characteristic shape. While shell 1, shell 6 and shell 7 denoted with the reference number 6500.1, 6500.6 and 6500.7 contribute mainly to the scanning integrated energy at the field edges, contributions of shell 3 and shell 4 denoted with the reference numbers 6500.3, 6500.4 have a maximum at the field center. The contributions of shell 2 and shell 5 denoted with reference numbers 6500.2, 6500.5 lie between the above extreme cases and shell 8 denoted with reference number 6500.8 can be called the complement of shell 2 and shell 5 concerning the scanning integrated energy. All these dependencies are be influenced and may be especially selected by a proper arrangement of the first raster elements.

The entire scanning integrated energy $SE_N(x)$ can be split in the contributions from the single shells of the collector. For a 8-shell collector $SE_N(x)$ is:

$$SE_N(x) = \sum_{i=1}^{8} \alpha_i SE_N^i(x)$$

with $\alpha_i$: linear scaling factor for the $i^{th}$ collector shell $SE_N^i(x)$: scanning integrated energy for the $i^{th}$ mirror shell Thus the scanning integrated energy is given by a linear combination of the scanning integrated uniformity contributions of the collector shells with linear scaling factors $\alpha_i$, with i for the $i^{th}$ collector shell. For example, a 10% higher transmission of shell 1 can be taken into account by choosing $\alpha_1 = 1.1$.

Figure 14:
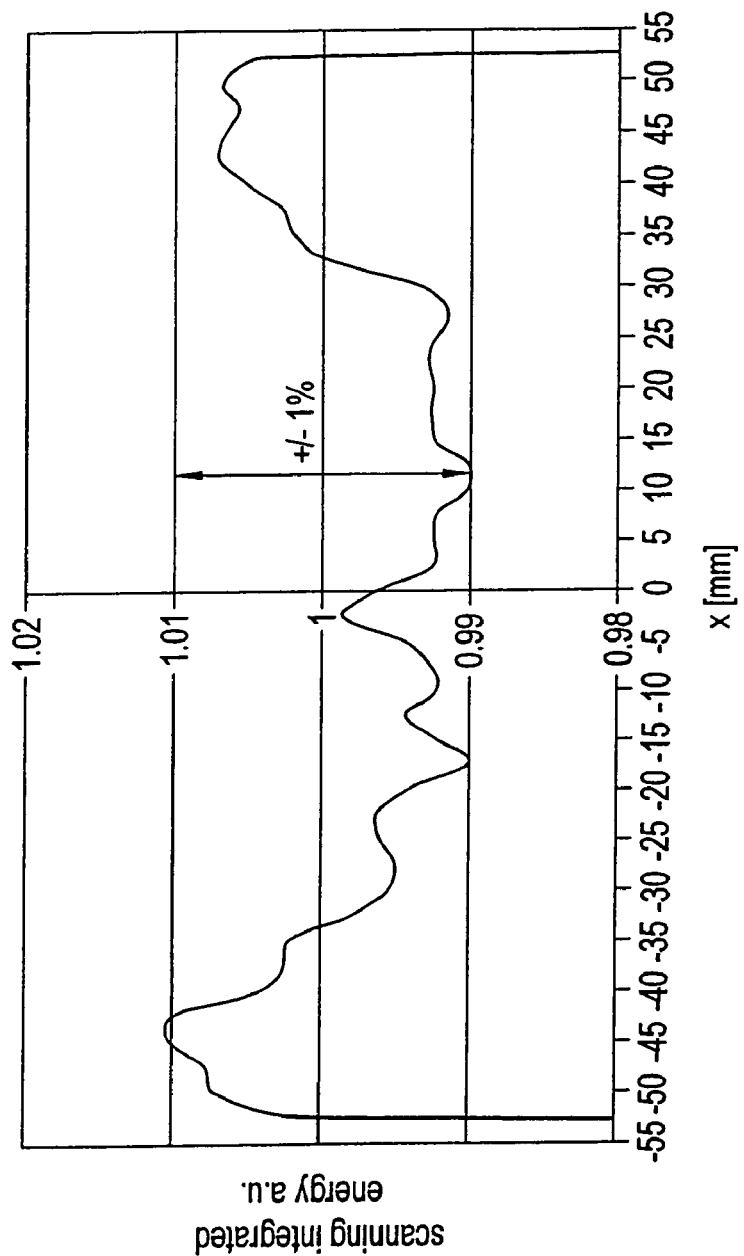
FIG. 14 shows the uniformity error in dependence from a transmission change of different mirror shells.

FIG. 14 shows the scanning integrated energy in the field plane for a illumination system comprising a collector with eight mirror shells. In this example, the scanning integrated energy distributions $SE^i(x)$ of the different shells have been scaled in such a way, that with linear factors $\alpha_i = 1$ for all shells a minimum uniformity error $\Delta SE(x)$ of less than 1% is achieved.

If, for example, the source characteristic changes, the radiant intensity emitted into the collection angles of the $j^{th}$ collector shell changes and thus in first order the scanning integrated intensity contribution of the $j^{th}$ collector shell is changed. This change can be described by a change of the linear factor $\alpha_j$. The impact of the different source characteristics on uniformity can thus be directly evaluated and the required correction by e.g. a transmission filter or the new required reflectivity of the $j^{th}$ collector shell, to be achieved by a different coating material, can directly be derived, so that the resulting linear factor is given by $\alpha_j = 1$ after the correction again.

A change of the transmission of the different mirror shells can be achieved by different coatings on the mirror shells, e.g the coating of the first mirror shell is different from the coating of the second mirror shell.

In an alternative embodiment to change the transmission of the different shells a filter element can be situated at the object-side of the collector. The filter element has a different transmission for light receiving different mirror shells e.g. the filter element has a first transmission of light entering the first mirror shell and a second transmission for light entering the second mirror shell and the first transmission is different from the second transmission. One can also adjust the transmission of different mirror shells, if the filter element is situated on said image side. Also filter elements located both at the object side as well as at the image side are possible.

If, for example, the source for which the illumination system is optimized, is replaced by a source of a different pinch geometry, the radiant intensity collected by the different collector shells might be different. The radiant intensity is in general a function of the collection angle. With a different coating on a selected collector shell, for example the sixth shell, the linear factor $\alpha_6$ will be changed. However, in reality the reflectivity depends also on the reflection angle and thus the contribution of the sixth collector shell to the scanning integrated intensity $SE_6(x)$ will also change slightly. This higher order effects are, however, small in comparison to the effects due to the change of the factor $\alpha_6$. For the compensation of this higher order effects, which disturb the ideal uniformity at a reticle plane, for example a variable uniformity correction filter close to the reticle plane can be applied.

Figure 15:
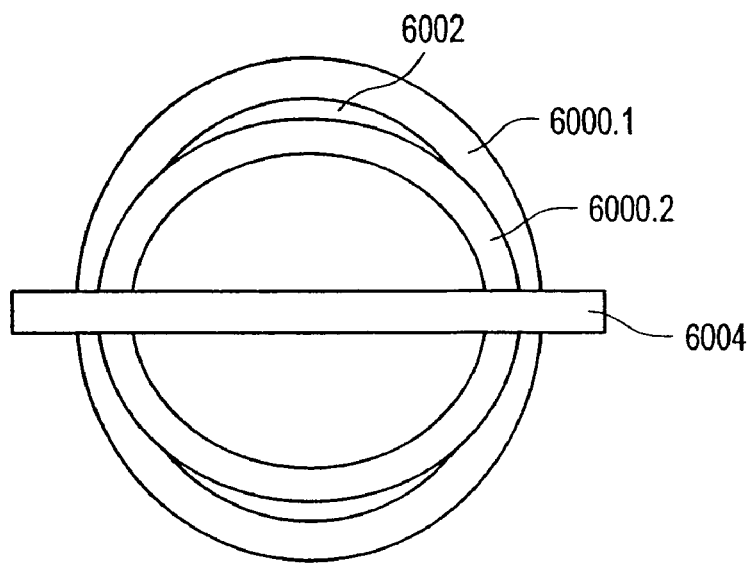
FIG. 15 show a collector with two mirror shells in the x-y-plane under thermal load.

The uniformity of the illumination in the field plane is also influenced by thermal effects, especially in operation the mirror shells are heated up by the radiation impinging onto the mirror shells, e.g. IR-radiation or radiation which is not fully reflected, but absorbed by the mirror shell. By heating up the mirror shells are deformed and the uniformity in the field plane is influenced. To keep the influence with regard to uniformity in the field plane as small as possible, the material for the fastening devices of the mirror shells and the collector shells itself can be selected having a proper thermal expansion coefficient. This holds true especially for the support spokes. The material for the support spoke is choosen such, that a essentially rotational symmetric expansion of the different mirror shells under thermal load is achieved. FIG. 15 shows the behavior of different shells under thermal load, if the fastening devices do not have a thermal expansion coefficient which provides for a substantially rotational symmetric expansion of the different mirror shells. The first mirror shell is denoted with the reference number 6000.1, the second mirror shell with the reference number 6000.2. The mirror shells are depicted in the local x-y-plane. As can clearly seen from FIG. 15 in such a case a gap 6002 arises between the first mirror shell 6000.1 and the second mirror shell 6000.2. This gap provides for a uniformity error. By providing a fastening devices, especially a spoke 6004 having a thermal expansion coefficient which provides for an substantially rotational symmetric expansion of the different mirror shells, such a gap 6002 in illumination can be prevented and thus uniformity can be increased.

The heatload absorbed from the individual collector shells and the heatload guided to the support spokes from the collector shells by thermal conduction might depend on the size and collection aperture of each collector shell; it might further depend on the special source characteristics, i.e. the amount of power and spectral distribution the source emits in an angle with respect to the optical axis of the collector.

In a preferred embodiment the collector shells might be of different materials. The collector shells can be made by replication techniques coating techniques. The coating of a mirror shell comprises the coating of metals or metal alloys such ase.g. Nickel, Copper, Steel, Aluminium. The collector shells can also be made by a polishing process e.g. in quartz, or made by replication techniques in polymers.

In still another embodiment of the invention the collector advantageously comprises a cooling and/or a heating device. The cooling and/or heating device provides for a essentially equal deformation in shape of the first mirror shell and the second mirror shell. This can be achieved e.g. by either a uniform heating of the different collector shells or a non-uniform heating or cooling of the collector spokes. The heating can be established by additional light sources, emitting e.g. in the infrared region. This light in the infrared region is additionally absorbed by the collector shells, or by a conductance heating or cooling, respectively, which can also be established by a liquid or a gas flow in a pipe system.

In another preferred embodiment the collector shells are mounted with active fastening devices on the collector spokes to change the collector deformation by active manipulation of the fastening devices. By this method, the radial position of the fastening devices can be changed to compensate for the thermal expansion of the circumferencial length of a collector shell. The fastening devices can be piezo-electric driven linear stages with ranges of the order of up to 200 μm.

In another preferred embodiment, each collector shell is mounted on a different, spatially separated spoke wheel. The spoke wheels can be arranged in a subsequent arrangement in a direction of the optical axis to keep the shadowing of the spoke wheels and thus the light loss at minimum. Each spoke wheel can be made of a different selected material of different thermal expansion to compensate for the expansion of the corresponding collector shell. Furthermore, each spoke can be provided with actively manipulated fastening devices to compensate for collector shell deformations.

In a preferred embodiment, each of the spoke wheels can be adjustable along the optical axis to compensate for different focal drifts of the collector shells. The active manipulation of focal drift compensators may be driven by a direct measurements of the focal drift itself, or an indirect measurement and a precalculated compensation table. For example, a temperature of the corresponding collector shells can be measured or a running time of a source can be integrated. From such values, the focal drift can be derived.

Figure 16:
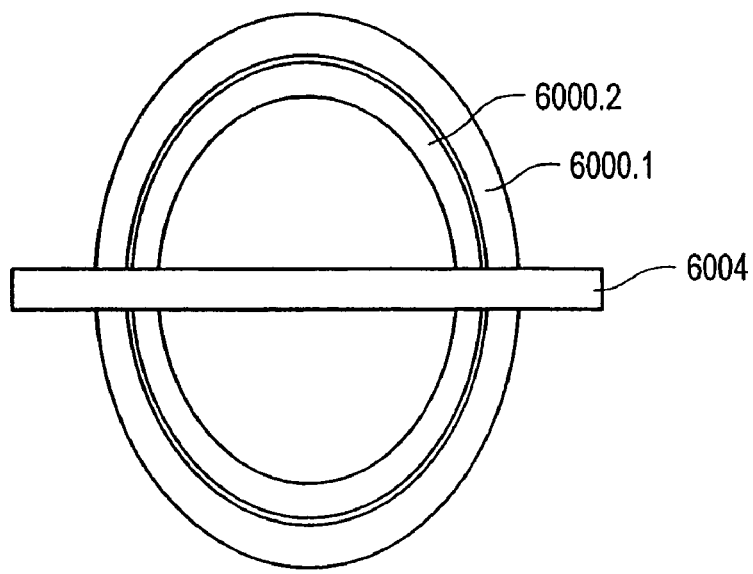
FIG. 16 show a collector with two mirror shells in the x-y-plane under thermal load, where the shape of the two mirror shells is essentially the same.

In FIG. 16 a the illuminated field in a plane behind a collector with two mirror shells which have an essential equal deformation under thermal load is shown. As is shown in FIG. 16 under essentially equal deformation in this application is understood that the deformation of the mirror shells is such, that there is essentially no gap between the contribution to the illuminated field 6000.1 of the first mirror shell and the contribution 6000.2 of the second mirror shell and therefore uniformity is increased in the field plane.

Figure 17:
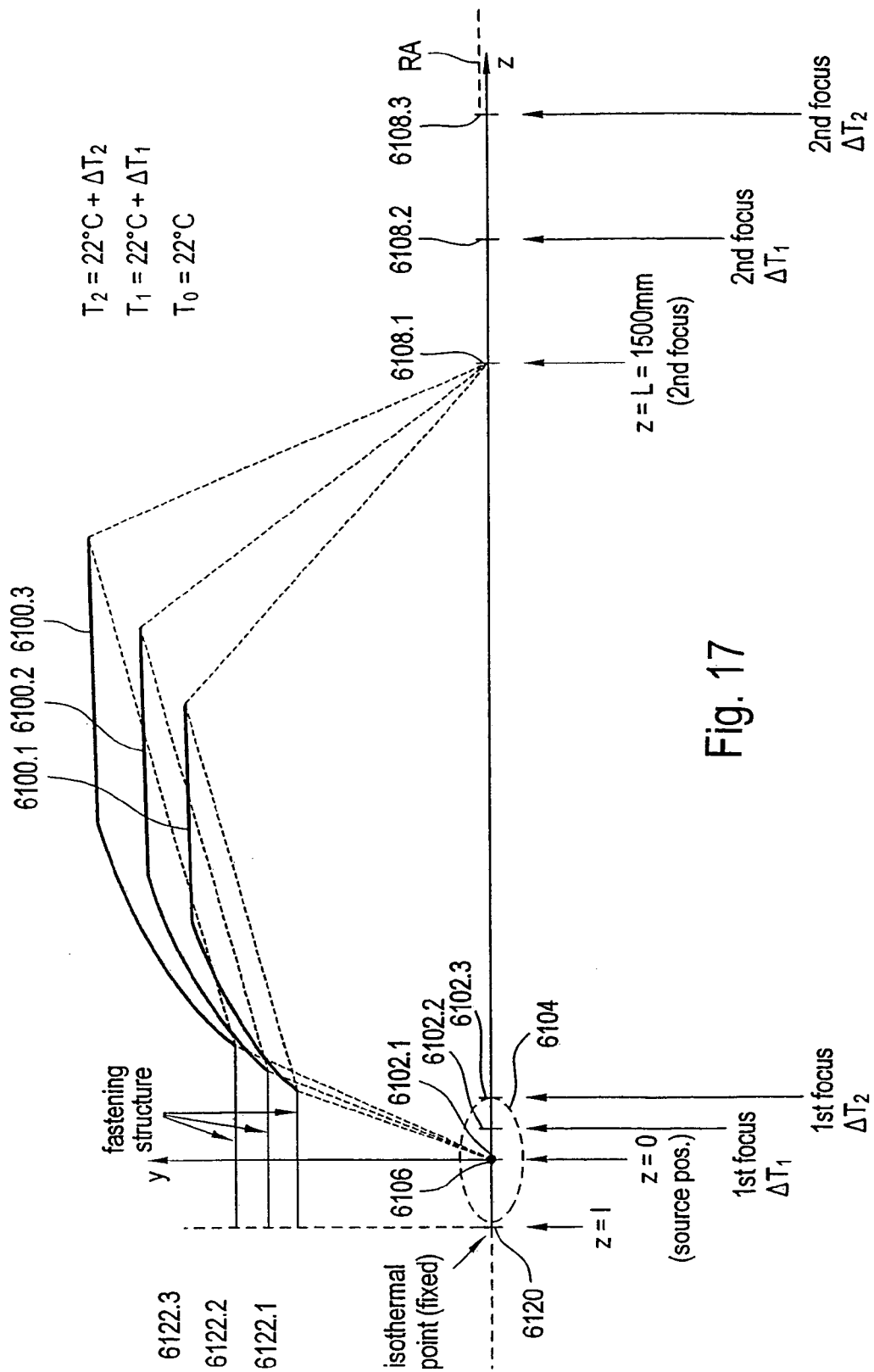
FIG. 17 show a collector shell and its behavior under thermal load in the z-plane FIG. 18 show a three-dimensional view of a collector comprising eight mirror shells and a holding device with four spokes.

In FIG. 17 for one mirror shell the position of the mirror shells for different temperatures in the local y-z-plane is shown. The mirror shells are rotational symmetric around the rotational axis RA. The rotational axis RA corresponds to the local z-axis of the component. The mirror shell 6100.1 show the position of the shell for $T_0=22°$ C. Mirror shell 6100.2 for the temperature $T_1=T_0+\Delta T_1$ and 6100.3 for the temperature $T_2=T_0+\Delta T_2$.

Moreover, in FIG. 17 are shown the z-position of the first focus and for the second focus or the so-called intermediate focus of the different mirror shells.

The center 6106 of an extended light source 6104 is located at the position of the first focus for the mirror shell 6100.1 at a temperature $T_0=22°$ C. The position of the first focus at the position z=0 is denoted with 6102.1.

The first focus position for a mirror shell with the temperature $T_1=22°$ C.$+\Delta T_1$ is denoted with 6102.2 and the first focus position for a mirror shell with a temperature $T_2=22°$ C.$+\Delta T_2$ is denoted with 6102.3.

In an preferred embodiment the light source has an extension including the first focus position 6102.2 at a temperature of $T_1=22°$ C.$+\Delta T_1$ and furthermore the first focus position 6102.3 of a mirror shell at a temperature of $T_2=22°$ C.$+\Delta T_2$.

The light source is denoted with the reference number 6104, the center of the light source with reference number 6106.

The second focus position or intermediate focus is denoted with 6108.1 for the mirror shell with a temperature $T_0=22°$ C., 6108.2 for the mirror shell with a temperature of $T_1=22°$ C.$+\Delta T_1$ and 6108.3 for the mirror shell with the temperature $T_2=22°$ C.$+\Delta T_2$.

In case of an extended light source 6104 with an extension comprising all first focus positions 6102.1, 6102.2, 6102.3 as described and shown in FIG. 17, a isothermal point 6120 for the fastening device in z-direction can be calculated as $$l = \frac{L}{1-\beta^2} \quad \text{(b)}$$

with

I: distance between the isothermal point of fastening 6120 and the center 6106 of the light source 6104

L: z-position for the second focal point 6108.1 at room temperature, e.g. $T_0=22°$ C.

β: linear magnification.

In the embodiment shown in FIG. 17 the EUV-collector has a focus length with L=1500 mm and a linear magnification of β~7. Then from the above formula an isothermal point in z-direction with I~−31.25 mm results. As is apparent from FIG. 17 the fastening device from a thermal and optical point of view is ideal if it is chosen in a small distance to the light source 6104.

Furthermore, the fastening structure should be out of the same material as the mirror shells. The fastening structure is also refered to as a mounting structure.

To limit the uniformity error which is caused by defocusing due to temperature effects, one has to limit the temperature variation of the mirror shells.

In the embodiment shown in FIG. 17 one can calculate the uniformity error if one assumes a extended light source 6104 with a source density distribution which has the shape of a Gauss-function and a half width of d=0.8 mm. The density distribution is then $$D_Q(z) = \frac{1}{N} \exp\left(-\frac{z^2}{2\sigma}\right), \quad \text{(c)}$$

wherein σ=0.462 $mm^2$.

The loss of transmittance Δt due to the defocusing Δz is then:

$$\Delta t = \frac{D_Q = (0) - D_Q(\Delta z)}{D_Q(0)}, \quad (d)$$

$\Delta z$ is the deviation from a mean defocusing $\Delta z_m$, wherein $\Delta z_m$ is defined as $$\Delta z_m = \frac{1}{8} l\alpha \sum_{i=1}^{8} \Delta T_i, \quad (e)$$

wherein the collector comprises eight mirror shells and
I: distance between the isothermal r point of fastening 6120 and the center 6106 of the light source 6104
α: thermal expansion coefficient
$\Delta T_i$: difference between the temperature of the heated up mirror shell and room temperature of e.g. 22° C.

Since the change of transmission causes a uniformity error one can calculate with equation $$\Delta z_{max} = \sqrt{-2\sigma \ln(1 - \Delta t_{max})}. \quad (f)$$

that the first focus positions of all mirror shells must lie within a region of $2\Delta z_{max}=0.462$ mm, if the uniformity error is limited to a maximum of $\Delta U=0.5\%$ Through to the thermal deformation of the mirror shells also the second focus position changes. Taking this into account the following inequality results $$I\alpha\Delta T_{max} \leq \Delta z_{max} \quad (g)$$

For the embodiment shown in FIG. 17 with a z-position L=1500 mm and for the second focal position 6108.1 at room temperature e.g. $T_0=22°$ C. of the mirror shell and a distance I=275 mm for the isothermal point of fastening 6120 as well as a thermal expansion coefficient of $\alpha=13\cdot10^{-6}$ for nickel the maximum temperature should be $T_{max}=\sim85°$ C.

As is apparent from the foregoing description heating up the mirror shells will result in a thermal deformation of each of the mirror shells. To prevent deformation stress within a collector comprising a plurality of mirror shells it is one further aspect of the invention to provide for fastening techniques which prevent such a deformation.

Figure 18:
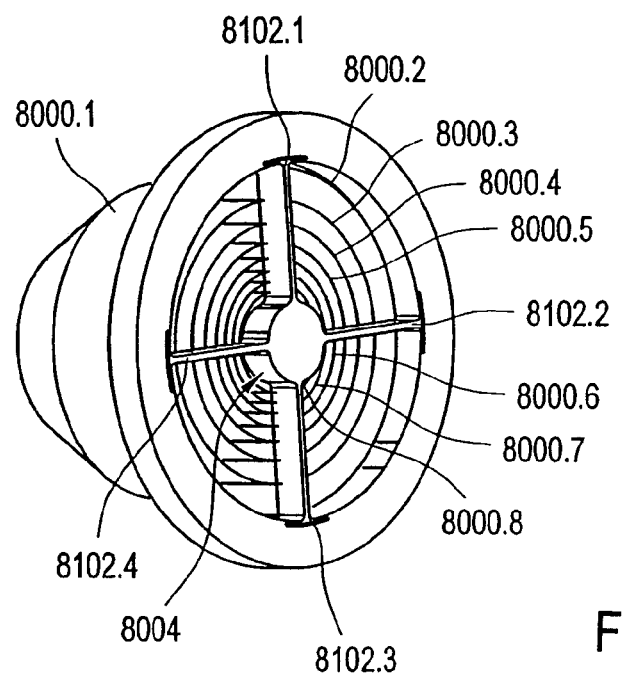
Figure 19:
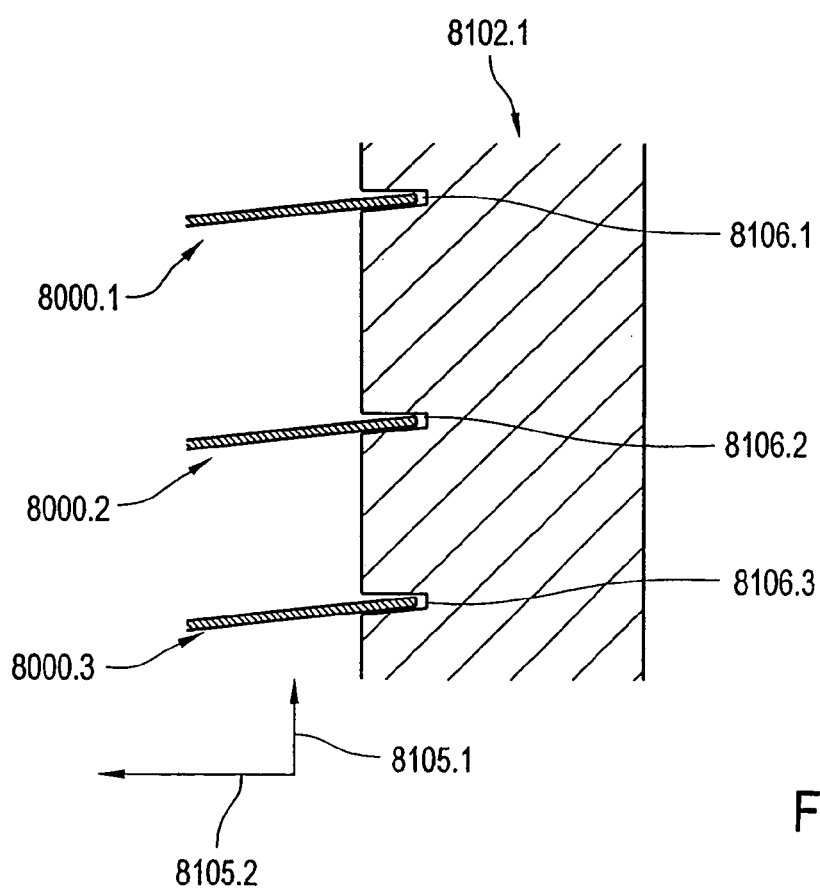
FIG. 19 show in a detailed view the fastening of three mirror shells in a spoke of a spoke wheel FIG. 20 schematic view of a connection between a mirror shell and a spoke of a spoke wheel FIG. 21 first embodiment of a connection according to FIG. 20

In FIG. 18, a three-dimensional view of a nested collector comprising eight mirror shells 8000.1, 8000.2, 8000.3, 8000.4, 8000.5, 8000.6, 8000.7, 8000.8 are shown. The mirror shells are fastened by four spokes 8002.1, 8002.2, 8002.3, 8002.4 of a spoke wheel 8004. One of the spokes 8002.1 is shown in greater detail in a partial view in FIG. 19 for three of the eight the mirror shells 8000.1, 8000.2 and 8000.3. For the mirror shells 8000.1, 8000.2 and 8000.3 are shown the points of fixation 8006.1, 8006.2, 8006.3 of each of the individual mirror shells 8000.1, 8000.2 and 8000.3. The directions 8105.1 and 8105.2 denote the directions of movement of the mirror shells 8000.1, 8000.2 and 8000.3 under thermal expansion. If one wants to avoid stress deformation due to expansion of the mirror shells and their fixation at the fastening device e.g. the spoke wheel 8004, one has to reduce the rigidity of connection between the spokes 8002.1, 8002.2, 8002.3, 8002.4 and the individual mirror shells 8000.1, 8000.2, 8000.3, 8000.4, 8000.5, 8000.6, 8000.7, 8000.8 to a value smaller than the rigidity of the mirror shells 8000.1, 8000.2, 8000.3, 8000.4, 8000.5, 8000.6, 8000.7, 8000.8 itself. This means the following inequation holds true:

rigidity connection mirror shell–spoke<rigidity mirror shell.

Figure 20:
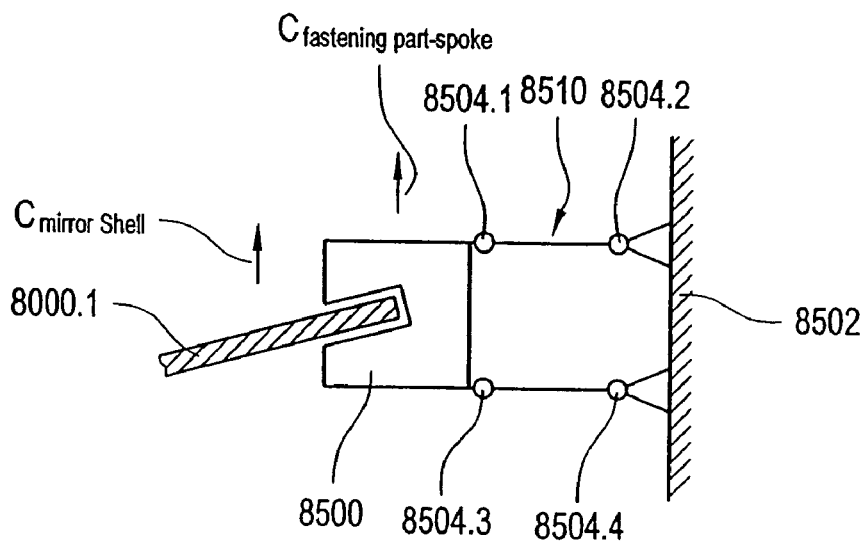

This is shown in principle in FIG. 20.

According to FIG. 20, a mirror shell 8000.1 is fixed in fastening part 8500 via form closure or frictional connection.

The fastening part 8500 is coupled to the spoke 8502 of a spoke wheel via joints 8504.1, 8504.2, 8504.3, 8504.4 such, that for the connection 8510 between the fastening part 8502 the following holds true:

$$C_{fastening\ part-spoke} < C_{mirror\ shell} \quad (g)$$

$C_{fastening\ part-spoke}$ denotes the rigidity of the connection 8510 between the fastening part and the mirror shell and $C_{mirror\ shell}$ denotes the rigidity of the mirror shell.

Figure 21:
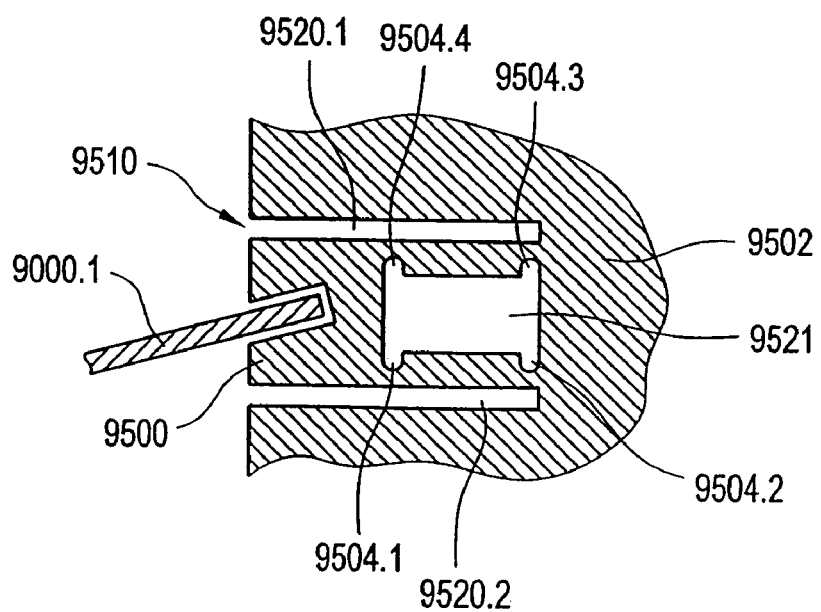

In FIG. 21 a first embodiment of a connection 9510 between the fastening part 9500 and the spoke 9502 for which the inequality (g) holds true according to FIG. 20 is shown.

The spoke 9502 has two cuttings 9520.1, 9520.2 as well as a sparing 9521. This provides for four joints 9504.1, 9504.2, 9504.3, 9504.4 connecting the fastening part 9500 with the rigid spoke 9502. The mirror shell is denoted with 9000.1.

Figure 22:
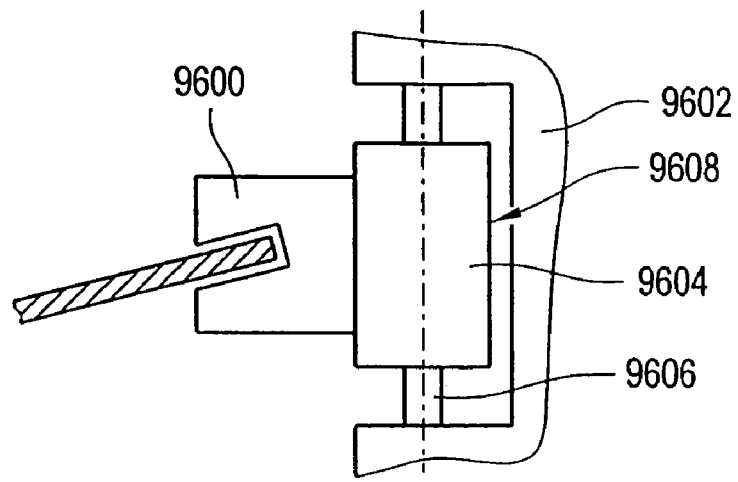
FIG. 22 second embodiment of a connection according to FIG. 20
Figure 23:
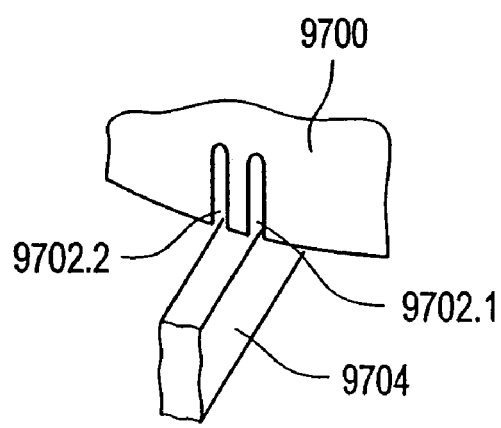
FIGS. 23–24 connection between a mirror shell and a spoke of a spoke wheel via a leaf spring in axial direction of the mirror shell FIGS. 25–26 connection between a mirror shell and a spoke of a spoke wheel via a leaf spring in horizontal direction of the mirror shell FIG. 27 first embodiment of a active connection between a mirror shell and a spoke of a spoke wheel FIG. 28 second embodiment of a active connection between a mirror shell and a spoke of a spoke wheel.

Another embodiment is shown in FIG. 22. For this embodiment of also the rigidity of the connection between the fastening part and the spoke is much lower than the rigidity of the mirror shell. In FIG. 23 the fastening part is denoted with reference number 9600 and the spoke with reference number 9602. The fastening part is fixed to the spoke of the spoke wheel via a bearing 9604. The bearing can be a plane bearing or a ball bearing.

The bearing together with the guiding 9606 forms a moveable or sliding unit 9608.

By using a bearing, the rigidity of the connection between the fastening part and the spoke can be reduced drastically to a value near zero.

In FIG. 23 still another embodiment of the invention is shown. According to FIG. 23 the mirror shell 9700 itself comprises two cuttings 9702.1, 9702.2 in the area where the mirror shell 9700 is fixed to the spoke 9704. Due to the cuttings, a sort of a leaf-spring or a plate spring is provided and the mirror shell is decoupled by this spring-like connection from the spoke of the spoke wheel.

Figure 24:
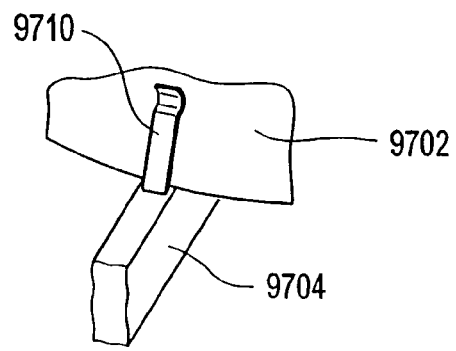

Alternatively, to provide the leaf-spring by the mirror shell 9702 itself by two cuttings, a external, additional leaf-spring 9710 can be fixed to the spokes 9704 as well as the mirror shell 9700 for example by gluing, soldering or welding. The additional leaf-spring 9710 is depicted in FIG. 24. The additional leaf-spring as shown in FIG. 25 is fixed in axial direction of the mirror shell.

Figure 25:
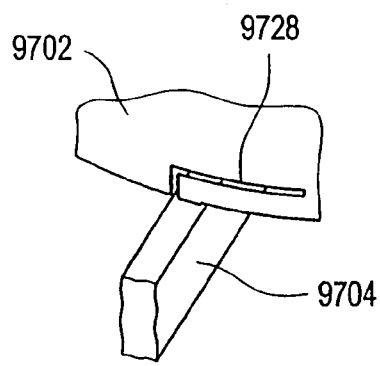
Figure 26:
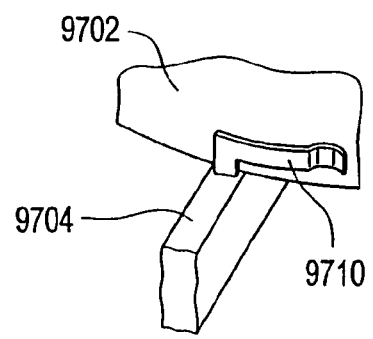

Alternatively, such a leaf-spring can also be fixed to the mirror shell in azimuthal direction as shown in FIG. 25 and 26. As shown in FIG. 25 the leaf-spring can be either provided integrally by a cutting 9728 into the mirror shell 9702 by the mirror shell itself or by an external leaf-spring 9710 as in FIG. 26.

Figure 27:
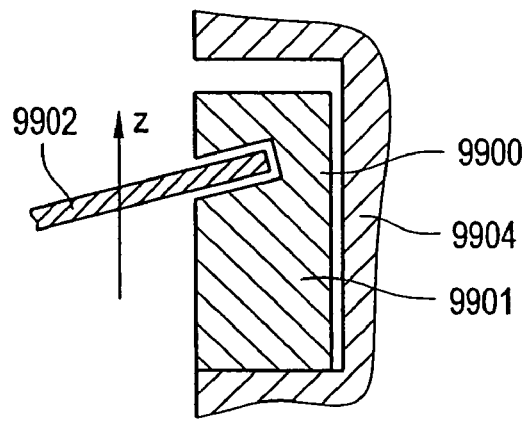

Apart from the passive couplings in which the rigidity of the coupling between the mirror shell and the spoke of e.g. a spoke wheel must be lower than the rigidity of the mirror shell, active couplings can be provided. In an active coupling a mechanism provides for moving the fastening part of the mirror shell along a direction in which the mirror shell has the lowest deformation due to the temperature difference. Such an apparatus is called a thermal actuator. Such a system is shown in FIG. 27. The actuator 9901 element can be made of a material with known thermal expansion coefficient. In case of heating up the material with the known thermal expansion coefficient this material will expand for example in the z-direction as shown in FIG. 27. Since in this case the actuator element is also the fastening part 9900 of the mirror shell 9902 a moving of the fastening part 9900 to a position, is provided in which the mirror shell 9902 has a very low deformation induced by the fastening part when temperature rises. The spoke is denoted with reference number 9904.

Figure 28:
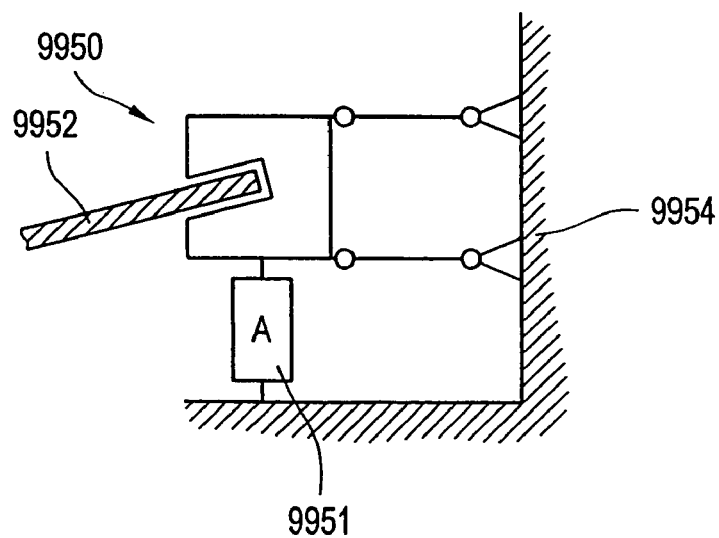

As an alternative embodiment the fastening part 9950 can comprise sensors (not shown) and actuators 9951 as shown in FIG. 28. The sensor detects the deformation of the mirror shell 9952 due to the thermal heating up and the actuator 9951 moves the fastening part 9950 with respect to the spoke 9954 of the spoke wheel for example in a position in which the mirror shell always has the a ring shaped form around a common optical axis regardless how the temperature would influence the shape of the mirror shell by deformations.

The control system can also provide for an adjustment of the fastening part such, that always the mirror shell has the lowest deformation as possible.

As actuators one can use electromagnetic systems, piezoelectric systems, forcing levers or transmission wires.

It should be understood that various alternatives and modifications of the present invention can be derived for those skilled in the art, especially all combinations of the claims are possible. The present invention is intended to embrace all such alternatives, modifications and variances that fall in the scope of the appended claims.

The invention claimed is:

1. A projection exposure system operable in a scanning mode along a scanning direction, comprising:
    a collector that receives light having a wavelength $\leq 193$ nm and illuminates a region in a plane, wherein said plane is defined by a local coordinate system having a y-direction parallel to said scanning direction and an x-direction perpendicular to said scanning direction, wherein said collector comprises:
    (a) a first mirror shell;
    (b) a second mirror shell within said first mirror shell, wherein said first mirror shell and said second mirror shell are substantially rotational symmetric about a common rotational axis; and
    (c) a fastening device for fastening said first mirror shell and said second mirror shell,
    wherein said fastening device has a support spoke that extends in a radial direction of said first and said second mirror shells, and
    wherein said support spoke, when projected into said plane, yields a projection that is non-parallel to said y-direction.

2. The projection exposure system of claim 1, wherein said first mirror shell and said second mirror shell each comprise a mirror segment having an optical surface area.

3. The projection exposure system of claim 1, wherein said support spoke has a shape tapering in a radial direction towards said common rotational axis.

4. The projection exposure system of claim 1, wherein said support spoke comprises grooves into which said first mirror shell and said second mirror shell are embedded.

5. The projection exposure system of claim 1, wherein said support spoke tapers in a direction of said common rotational axis towards said plane.

6. The projection exposure system of claim 1,
    wherein said spoke is one of a plurality of spokes, and
    wherein at least one spoke of said plurality of spokes extends parallel to said x-direction when said plurality of spokes are projected into said plane.

7. The projection exposure system of claim 6, wherein said plurality of support spokes includes (i) a first support spoke made of a material having a first thermal expansion coefficient, and (ii) a second support spoke made of a material having a second thermal expansion coefficient that is different from said first thermal expansion coefficient.

8. The projection exposure system of claim 1, wherein said projection exposure system further comprises an optical element having a plurality of raster elements, wherein said optical element is arranged substantially in said plane.

9. The projection exposure system of claim 8, wherein said projection is non-parallel to said x-direction and intersects said plurality of raster elements at different locations on said plurality of raster elements.

10. The projection exposure system of claim 9, further comprising:
    a mask; and
    a projection lens for projecting said mask onto a light-sensitive object.

11. A method for producing a microelectronic component, comprising employing the projection exposure system of claim 10.

* * * * *